United States Patent
Lin et al.

(10) Patent No.: US 7,459,756 B2
(45) Date of Patent: Dec. 2, 2008

(54) METHOD FOR FORMING A DEVICE HAVING MULTIPLE SILICIDE TYPES

(75) Inventors: Chun-Chieh Lin, Hsin-Chu (TW); Wen-Chin Lee, Hsin-Chu (TW); Yee-Chia Yeo, Kaoshiung (TW); Chuan-Yi Lin, Hsin-Chu (TW); Chenming Hu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 148 days.

(21) Appl. No.: 11/467,980

(22) Filed: Aug. 29, 2006

(65) Prior Publication Data

US 2006/0286740 A1 Dec. 21, 2006

Related U.S. Application Data

(62) Division of application No. 10/831,021, filed on Apr. 23, 2004, now Pat. No. 7,112,483.

(60) Provisional application No. 60/498,759, filed on Aug. 29, 2003.

(51) Int. Cl.
*H01L 29/76* (2006.01)
(52) U.S. Cl. .................... 257/384; 438/581; 257/412
(58) Field of Classification Search ............... 257/412; 438/581, 583, 384
See application file for complete search history.

(56) References Cited

U.S. PATENT DOCUMENTS

| | | | | |
|---|---|---|---|---|
| 6,051,494 A | * | 4/2000 | Iwamatsu et al. | 438/683 |
| 6,130,123 A | * | 10/2000 | Liang et al. | 438/217 |
| 6,166,417 A | * | 12/2000 | Bai et al. | 257/407 |
| 6,350,665 B1 | | 2/2002 | Jin et al. | |
| 6,380,024 B1 | | 4/2002 | Liaw | |
| 6,391,767 B1 | | 5/2002 | Huster et al. | |
| 6,413,859 B1 | | 7/2002 | Cabral, Jr. et al. | |
| 6,468,900 B1 | * | 10/2002 | Bertrand et al. | 438/655 |
| 6,534,405 B1 | | 3/2003 | Wu | |
| 6,534,837 B1 | * | 3/2003 | Bai et al. | 257/407 |
| 6,589,836 B1 | * | 7/2003 | Wang et al. | 438/231 |
| 6,835,639 B2 | * | 12/2004 | Rotondaro et al. | 438/592 |
| 7,338,865 B2 | * | 3/2008 | Murto et al. | 438/275 |
| 2002/0048919 A1 | * | 4/2002 | Iwamatsu et al. | 438/592 |
| 2003/0109121 A1 | * | 6/2003 | Rotondaro | 438/592 |
| 2004/0065930 A1 | * | 4/2004 | Lin et al. | 257/412 |
| 2007/0045742 A1 | * | 3/2007 | Wang et al. | 257/351 |

OTHER PUBLICATIONS

Kedzierski et al., "Metal-gate FinFET and fully-depleted SOI devices using total gate silicidation", 2002, 4 pages, 0-7803-X/02, IEEE.
"Bulk Silicon Technology for Complementary MESFETs", Apr. 27, 1989, pp. 565-566, vol. 25, No. 9, Electronics Letters.

(Continued)

*Primary Examiner*—Thao P. Le
(74) *Attorney, Agent, or Firm*—Haynes and Boone, LLP

(57) ABSTRACT

Provided is a semiconductor device and a method for its fabrication. The device includes a semiconductor substrate, a first silicide in a first region of the substrate, and a second silicide in a second region of the substrate. The first silicide may differ from the second silicide. The first silicide and the second silicide may be an alloy silicide.

31 Claims, 42 Drawing Sheets

OTHER PUBLICATIONS

Kedzierski et al., "Design analysis of thin-body silicide source/drain devices", Oct. 1, 2001, pp. 21-22, 0-7803-6739-1/01, IEEE International SOI Conference.

Kedzierski et al., "Complementary silicide source/drain thin-body MOSFETs for the 20nm gate length regime", 2000, pp. 3.4.1-3.4.4, 07-7803-6438-4, IEEE.

* cited by examiner

METHOD FOR FORMING A DEVICE HAVING MULTIPLE SILICIDE TYPES

CROSS-REFERENCE

This application is a divisional of U.S. patent application Ser. No. 10/831,021, filed Apr. 23, 2004, which claims priority from U.S. Provisional Patent Application Ser. No. 60/498,759, filed on Aug. 29, 2003, which is related to U.S. patent application Ser. No. 10/955,349, filed on Sep. 30, 2004, which claims priority from U.S. Provisional Patent Application Ser. No. 60/507,328, filed on Sep. 30, 2003.

BACKGROUND

The present disclosure relates generally to the field of semiconductor integrated circuits, more particularly, to a device having silicide and a method of fabricating such device.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing have been needed.

In metal-oxide-semiconductor field effect transistor (MOSFET) technologies, a silicide may be implemented for reliable contact and less contact resistance. The silicide may be used to provide an interface between metal lines and substrate contact regions, such as a polysilicon gate, a silicon source, and a silicon drain. Placing metal silicide on the source and drain regions may reduce the sheet resistance of the path between the metal contact and the underlying structure. However, although the same silicide is generally used on multiple transistor types, the sheet resistance of different transistors (e.g., NMOS and PMOS) may vary depending on the type of metal or silicide used.

Accordingly, what is needed in the art is a semiconductor device and the method of manufacturing thereof that addresses the above-mentioned issues.

BRIEF DESCRIPTION OF THE DRAWINGS

The present disclosure is best understood from the following detailed description when read with the accompanying figures. It is emphasized that, in accordance with the standard practice in the industry, various features are not drawn to the scale. In fact, the dimensions of the various features may be arbitrarily increased or reduced for clarity of discussion.

FIGS. 2b-2g are cross-sectional views of the structure of FIG. 1 during fabrication using the method of FIG. 2a.

FIG. 3b-3g are cross-sectional views of the structure of FIG. 1 during fabrication using the method of FIG. 3a.

FIG. 4b-4k are cross-sectional views of the structure of FIG. 1 during fabrication using the method of FIG. 4a.

FIG. 5b-5h are cross-sectional views of the structure of FIG. 1 during fabrication using the method of FIG. 5a.

FIG. 6b-6h are cross-sectional views of the structure of FIG. 1 during fabrication using the method of FIG. 6a.

DETAILED DESCRIPTION

Figure 1:
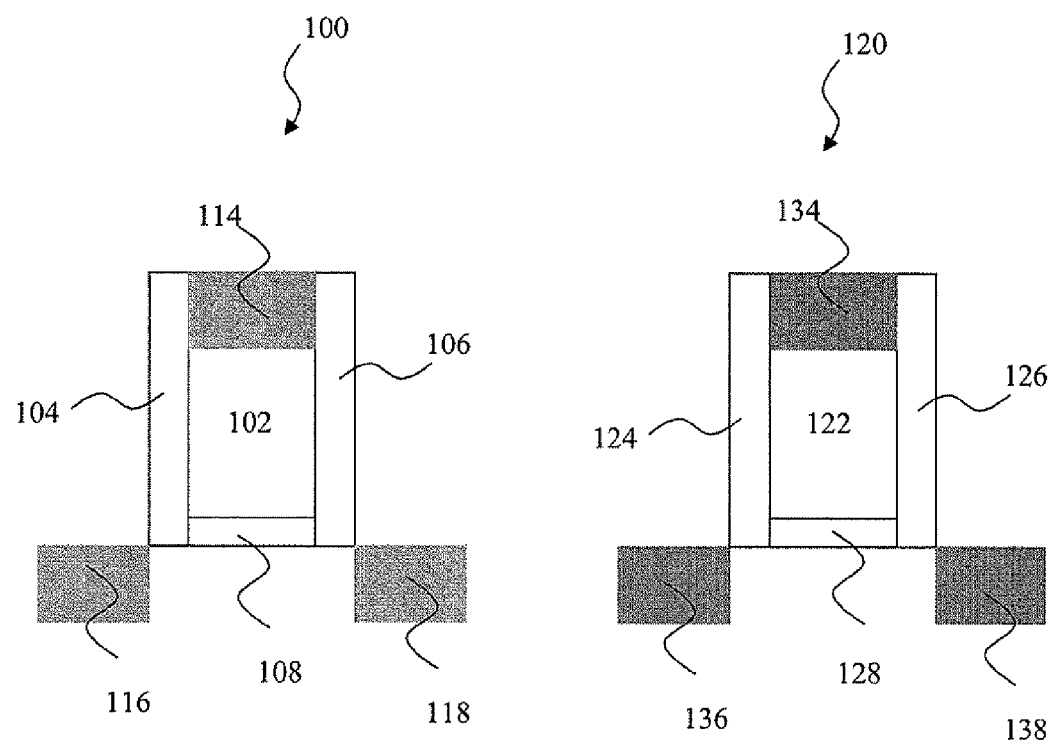
FIG. 1 is a schematic diagram of exemplary structure illustrating a particular implementation of the present disclosure.

The present disclosure relates generally to the field of semiconductor integrated circuits, more particularly, to a device having multiple silicide types and a method of fabricating such device. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Generally, both NMOS and PMOS devices are fabricated using the same metal or alloy silicide. Since the silicon source and drain in an NMOS device has a different doping than the silicon source and drain in a PMOS device, the work function of the differently doped drains and sources will be different. Accordingly, it is typically difficult to choose a silicide material that has a work function capable of reducing both NMOS and PMOS source/drain contact resistance.

Referring to FIG. 1, in one embodiment, a complementary silicide is provided in a single structure that compromises both an NMOS 100 and a PMOS 120. Both the NMOS 100 and the PMOS 120 may be fabricated on a semiconductor substrate (not shown). The NMOS 100 includes a gate electrode region 102, spacers 104 and 106, gate dielectric 108, gate silicide region 114, a source (not shown) and source silicide region 116, and a drain (not shown) and drain silicide region 118. The PMOS 120 includes gate electrode region 122, spacers 124 and 126, gate dielectric 128, gate silicide region 134, a source (not shown) and source silicide region 136, and a drain (not shown) and drain silicide region 138. It is understood that other components and/or layers may be present, but are not shown for purposes of clarity.

The semiconductor substrate on which the NMOS 100 and PMOS 120 are fabricated may use an elementary semiconductor including silicon or germanium in crystal, polycrystalline, or amorphous structure; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP; or a combination thereof. In one embodiment, the alloy semiconductor substrate may have gradient SiGe feature in which the Si and Ge composition change from one ratio at one location to another ratio at another location of the gradient SiGe feature. In another embodiment, the alloy SiGe is formed over silicon substrate. In another embodiment, a SiGe substrate is strained. More generally, the alloy semiconductor substrate may contain silicon, germanium, carbon, or combinations thereof. Furthermore, the semiconductor substrate may be a semiconductor on insulator, such as silicon on insulator (SOI), or a thin film transistor (TFT). In some examples, the semiconductor substrate may include a doped epi layer or a buried layer. In other examples, compound semiconductor substrate may have a multilayer structure, or the silicon substrate may include a multilayer compound semiconductor structure.

The NMOS 100 and PMOS 120 may be fabricated using a P-well, N-well, or dual-well structure, and may be fabricated directly onto or within the semiconductor substrate. In the present example, there is an isolation region (not shown) between the NMOS 100 and PMOS 120. The isolation region may utilize isolation technology, such as local oxidation of silicon (LOCOS) and shallow trench isolation (STI). Furthermore, the NMOS and PMOS may have a raised source and drain structure, a FINFET structure, a double gate structure, or a multi-finger structure. In addition, the NMOS and PMOS may include a high-stress film.

The gate dielectric 108 in the NMOS 100 and the gate dielectric 128 in the PMOS 120 may be a suitable dielectric material or may have a multilayer structure comprising multiple dielectric materials. Preferably, the dielectric material may have relatively high integrity and low current leakage. Examples of the dielectric material include silicon oxide, silicon nitride, silicon oxynitride, and a high k dielectric. The high k material may have permittivity greater than 10, including permittivities greater than 15 and 20. The high k dielectric may include hafnium oxide, zirconium oxide, aluminum oxide, a hafnium dioxide-alumina ($HfO_2$—$Al_2O_3$) alloy, or combinations thereof.

The NMOS gate electrode 102 and the PMOS gate dielectric 122 comprise conductive materials and may have multilayer structure. The gate electrode may be silicon-containing, germanium-containing, metal-containing, or a combination. The conductive material may comprise polycrystalline silicon (poly-Si), poly-SiGe, metal, metal silicide, metal nitride, metal oxide, or a combination thereof.

Spacers 104 and 106, which are positioned on both sides of the NMOS gate 102, and spacers 124 and 126, which are positioned on the both sides of the PMOS gate 122, may comprise a dielectric material such as silicon nitride, silicon oxide, silicon carbide, silicon oxynitride, or combinations thereof.

The NMOS 100 includes a source and a drain (not shown), which may be formed directly on the semiconductor substrate, in a P-well structure, or using a raised structure. Silicide may be formed on top of the source and drain to form source silicide region 116 and drain silicide region 118, respectively. The silicide may also be formed on top of the gate electrode 102 to form gate silicide region 114. The silicide regions 114, 116, and 118 in the NMOS 100 may comprise materials such as nickel silicide, cobalt silicide, tungsten silicide, tantalum silicide, titanium silicide, platinum silicide, erbium silicide, palladium silicide, or a combinations thereof.

The PMOS 120 includes a source and drain (not shown), which may be formed directly on the semiconductor substrate, in a N-well structure, or using a raised structure. Silicide may be formed on top of the source and drain to form source silicide region 136 and drain silicide region 138, respectively. The silicide may also be formed on top of the gate electrode 122 to form gate silicide region 134. The silicide regions 134, 136, and 138 in the PMOS 120 may comprise materials such as nickel silicide, cobalt silicide, tungsten silicide, tantalum silicide, titanium silicide, platinum silicide, erbium silicide, palladium silicide, or a combinations thereof.

In the structure of FIG. 1, the silicide used in silicide regions 114, 116, and 118 in the NMOS 100 (collectively referred to as "the NMOS silicide regions") is different from the silicide used in silicide regions 134, 136, and 138 in the PMOS 120 ("the PMOS silicide regions"). For example, the NMOS silicide regions and PMOS silicide regions may both be metal silicides, but of different types, or they may be alloy silicides of different composition, or alloy silicides of the same composition but with different material ratios. Similarly, the NMOS silicide regions may be a metal silicide, while the PMOS silicide regions may be an alloy silicide, or vice versa. Such silicide structures are sometimes referred to as complementary silicide. Complementary silicide may provide flexible fine-tuning of the NMOS silicide and PMOS silicide regions to improve contact resistance, adhesion, and/or compatibility.

In one example of a complementary silicide structure, different combinations of nickel and cobalt may be used in its implementation. This enables the composition for both the NMOS silicide regions and the PMOS silicide regions to be fine tuned for desired work functions and sheet resistances. For example, the NMOS silicide regions' work function may be tuned below approximately 4.4 eV, while the PMOS silicide regions' work function may be tuned above approximately 4.7 eV.

It is understood that the complementary silicide structure is not limited to NMOS and PMOS structures, but may be used to form any two silicide regions associated with a semiconductor substrate where the first region has a first type of silicide and the second region has a second type of silicide. Each region may include structures such as a doped silicon or doped poly-silicon area, a source, a drain, a gate, or combinations thereof. Furthermore, the structures in each region may comprise a device such as a NMOS, a PMOS, a CMOS, a FINFET, a bipolar transistor, a capacitor, a resistor, or combinations thereof.

Figure 2A:
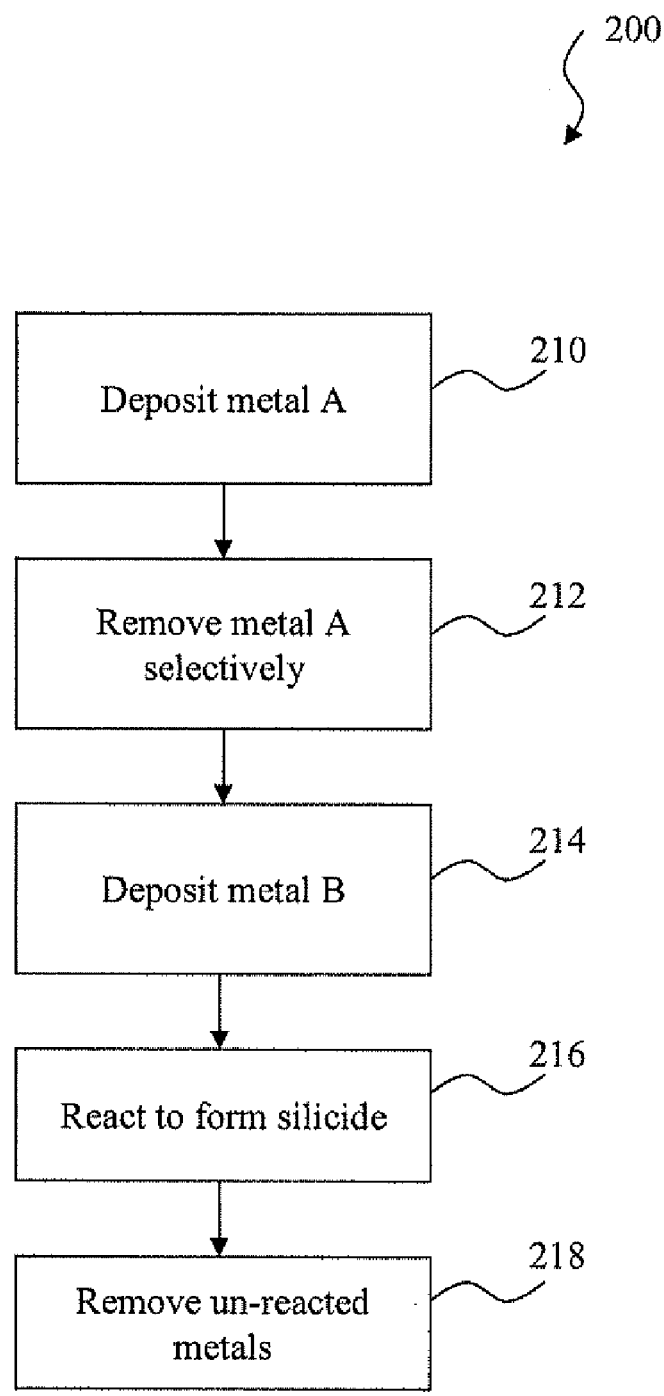
FIG. 2a is a flow chart illustrating a first exemplary method for fabricating the structure of FIG. 1.

Referring to FIG. 2a and with additional reference to FIGS. 2b-2g, in one embodiment, a method 200 may be used to form the complementary silicide structure of FIG. 1 with an NMOS and a PMOS. FIGS. 2b-2g illustrate cross-sectional views of an exemplary integrated circuit undergoing fabrication steps that correspond to steps of FIG. 2a. As the method 200 of FIG. 2a is described below in greater detail, the cross-sectional views in FIGS. 2b-2g may also be referred to for purposes of illustration. It is understood that the method 200 is not limited to the formation of a complementary silicide structure for NMOS and PMOS, but may be used to form any two regions during a semiconductor fabrication process where the first region has one composition or material ratio and the second region has a different composition or material ratio.

Figure 2B:
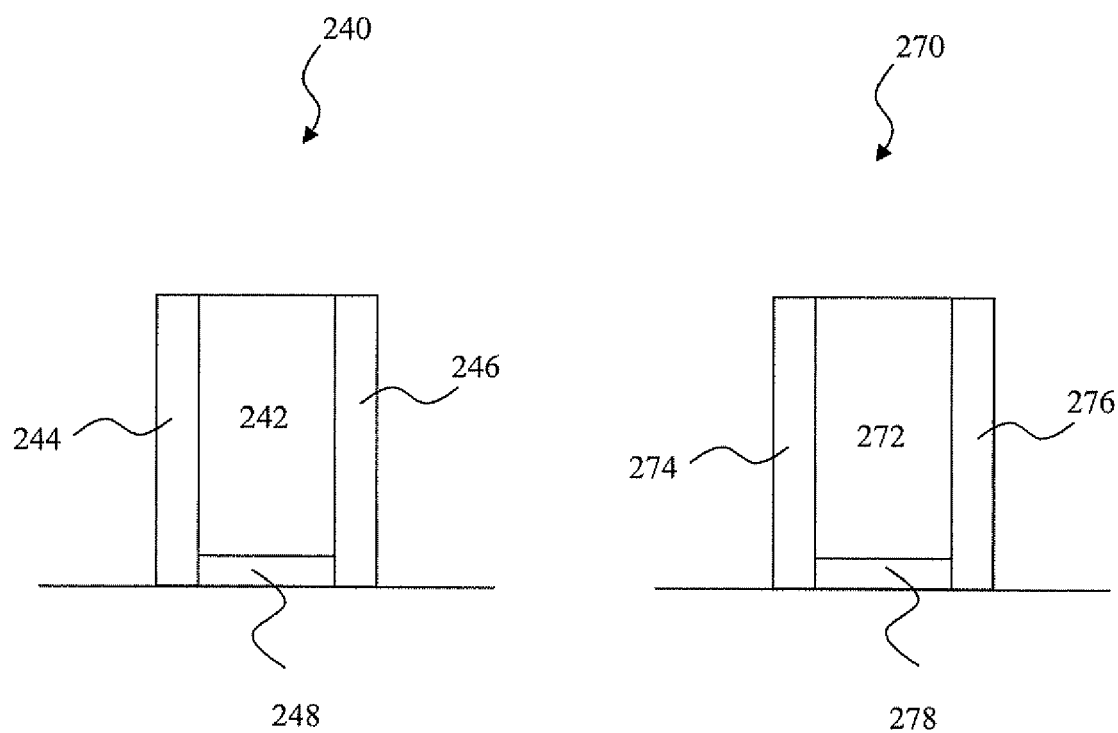

In the present example, the first region is an NMOS 240 and the second region is a PMOS 270, as illustrated in FIG. 2b. It is understood that portions of the NMOS 240 and PMOS 270 may be fabricated prior to the execution of the method 200. For example, the NMOS 240 includes a gate electrode 242, spacers 244 and 246, and a gate dielectric 248. The PMOS 270 includes a gate electrode 272, spacers 274 and 276, and a gate dielectric 278.

Figure 2C:
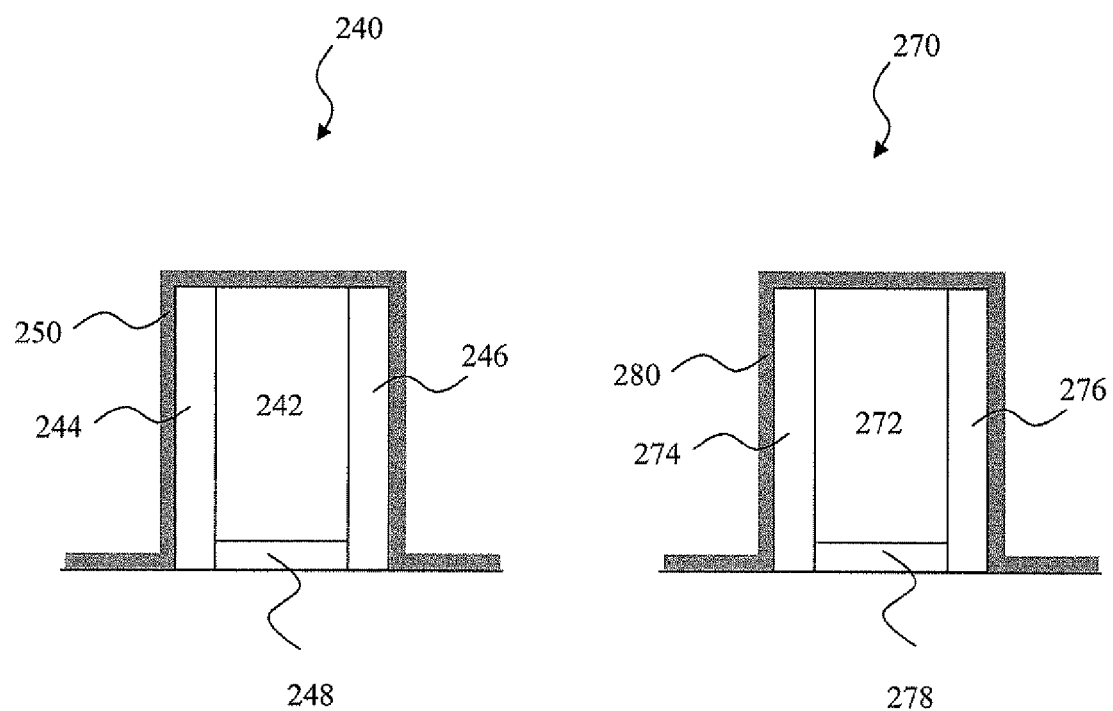

With specific reference now to FIGS. 2a and 2c, the method 200 begins in step 210 with the deposition of first metal portions 250, 280 (which are formed using the same metal 'A') over the NMOS 240 and PMOS 270, respectively. The first metal portions 250, 280 may be deposited using physical vapor deposition (PVD) such as sputtering and evaporation, or plating, or chemical vapor deposition (CVD) such as plasma enhanced CVD (PECVD), atmospheric pressure CVD (APCVD), low pressure CVD (LPCVD), high density plasma CVD (HDPCVD) and atomic layer CVD (ALCVD), or other deposition processes. In the present example, a sputtering deposition is used. The first metal portions 250, 280 may be nickel, cobalt, tungsten, tantalum, titanium, platinum, erbium, palladium, or any other metal able to interact with silicon at an elevated temperature to form silicide in a low resistance phase state.

In the present example, the first metal portions 250, 280 comprise nickel, which may offer advantages in silicide technology where the feature size is below 0.13 µm, because nickel generally requires a lower thermal budget than some other suitable metals. This enables nickel silicide to be formed in a single heating step at a relatively low temperature of about 250° C. to about 600° C., with an attendant reduction in silicon consumption in the substrate, thereby enabling the formation of ultra-shallow source/drain junctions. The nickel may be deposited by nickel sputtering, with a suitable process flow including HF dipping, an argon pre-sputter etch to prepare the surface, and then nickel sputtering.

Figure 2D:
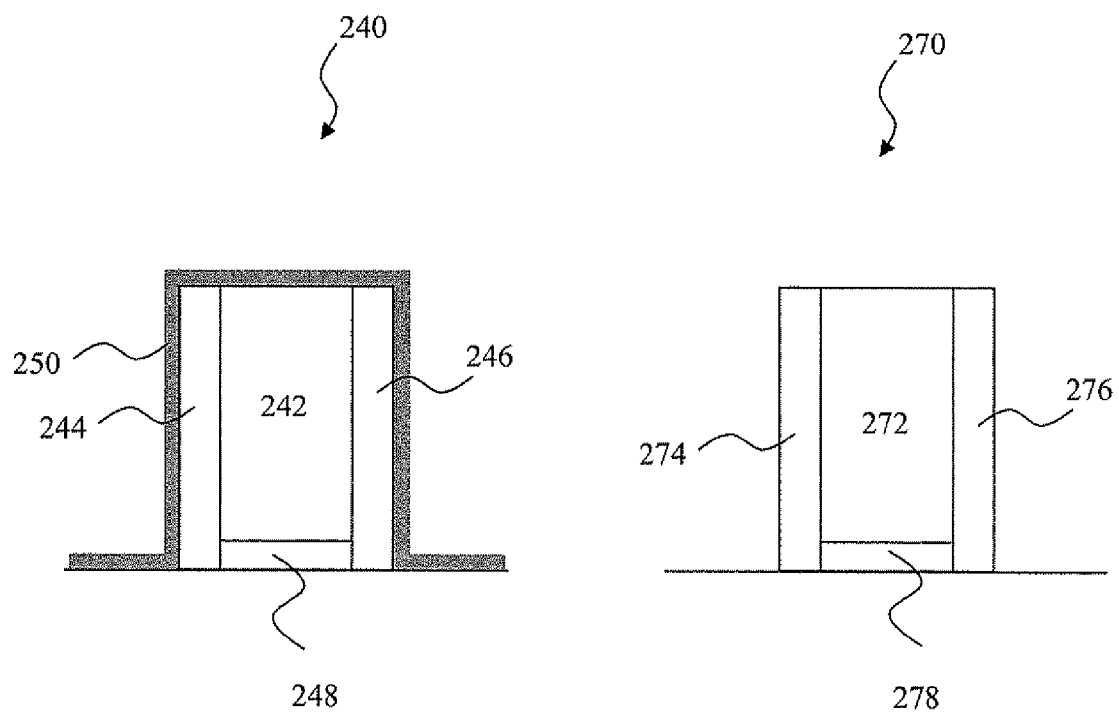

In step 212 and with additional reference to FIG. 2d, the first metal portion 280 may be removed selectively, leaving the first metal portion 250 intact. The first metal portion 280 may be selectively removed using such processes as photolithography and etching that are well know in the art. Such processes may include forming photo-resist on both metal portions 250 and 280, transferring the etching pattern from a mask to the photo-resist, etching, and stripping. Alternatively, the etching may follow the stripping. It is preferable that the etching process be chosen based on the first metal portion 280. For example, if the material is nickel, a wet etching process may be selected using metal etching solution such as sulfuric peroxide mixture ($H_2SO_4+H_2O_2+H_2O$). If the material is cobalt, a wet etching solution may include a mineral acid (e.g., HCl) and a peroxide solution.

Figure 2E:
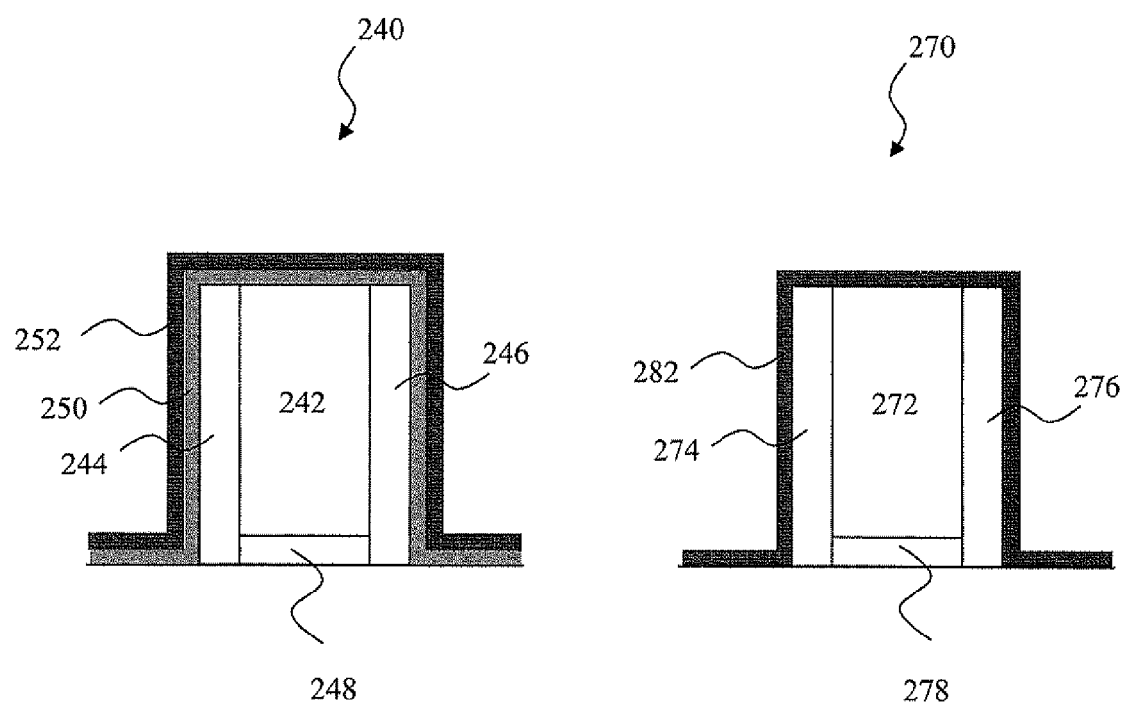

In step 214 and with additional reference to FIG. 2e, second metal portions 252, 282 are deposited over the NMOS 240 and PMOS 270, respectively. The second metal portions 252, 282 are formed using the same metal (metal 'B'), but it is a different metal or metal composition than that used to form the first metal portions 250, 280. The deposition process may use PVD or CVD. The second metal portions 252, 282 may comprise nickel, cobalt, tungsten, tantalum, titanium, platinum, erbium, palladium, or any other metal able to interact with silicon at an elevated temperature to form silicide in a low resistance phase state. In the present example, the second metal portions 252, 282 are cobalt.

Figure 2F:
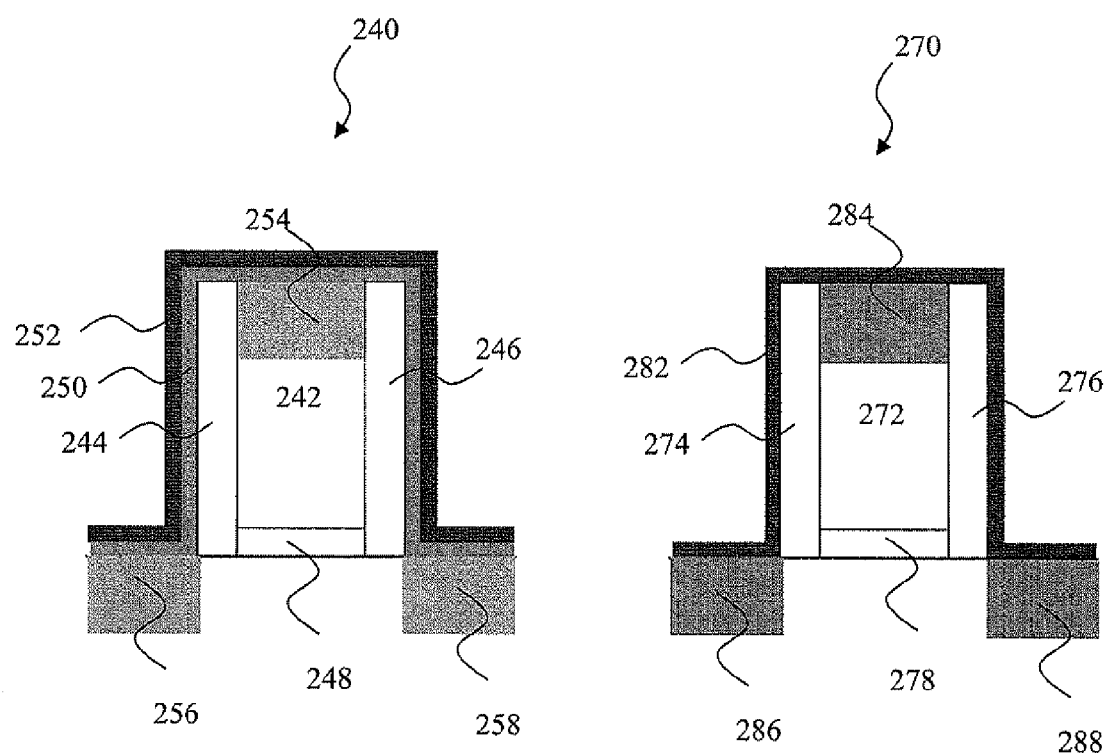

In step 216 and with additional reference to FIG. 2f, a silicide is formed on both the NMOS 240 and the PMOS 270. However, the silicide formed on the NMOS 240 is different than the silicide formed on the PMOS 270. This is because the silicide formed on the NMOS 240 contains both first metal portion 250 (e.g., metal A or nickel) and second metal portion 252 (e.g., metal B or cobalt) (referred to as alloy silicide), while silicide formed on the PMOS 270 contains only second metal portion 282 (cobalt).

As illustrated in FIG. 2f, silicide formed on the gate, source, drain of the NMOS 240 produces gate silicide 254, source silicide 256, and drain silicide 258. Silicide formed on the gate, source, and drain of the PMOS 270 produces gate silicide 284, source silicide 286, and drain silicide 288. The gate silicide 254, source silicide 256, and drain silicide 258 are alloy silicides (nickel and cobalt), while the gate silicide 284, source silicide 286, and drain silicide 288 are cobalt silicide. The A/B metal (e.g., nickel/cobalt) ratio in the alloy silicide may be adjusted to provide a desired work function by optimizing metal deposition processing and silicidation processing. Silicidation processing may be a reaction between the second metal (or first and second metals) and silicon (or poly-silicon) at an elevated temperature that is selected based on the specific metal or metals. Also referred to as annealing, this may use a rapid thermal annealing (RTA) process in a gas atmosphere such as Ar, He, N2, or other inert gas. Such reacted silicide may be in metastable phase and may need a second annealing step or RTA (e.g., at a higher temperature selected based on a particular metal and intended compound), thereby forming a stable silicide phase with reduced resistance. Such a second annealing step may also be implemented after step 218 (described below) which removes un-reacted metal. It is understood that some silicides, such as nickel silicide, may be formed in a one step RTA at a lower temperature.

Figure 2G:
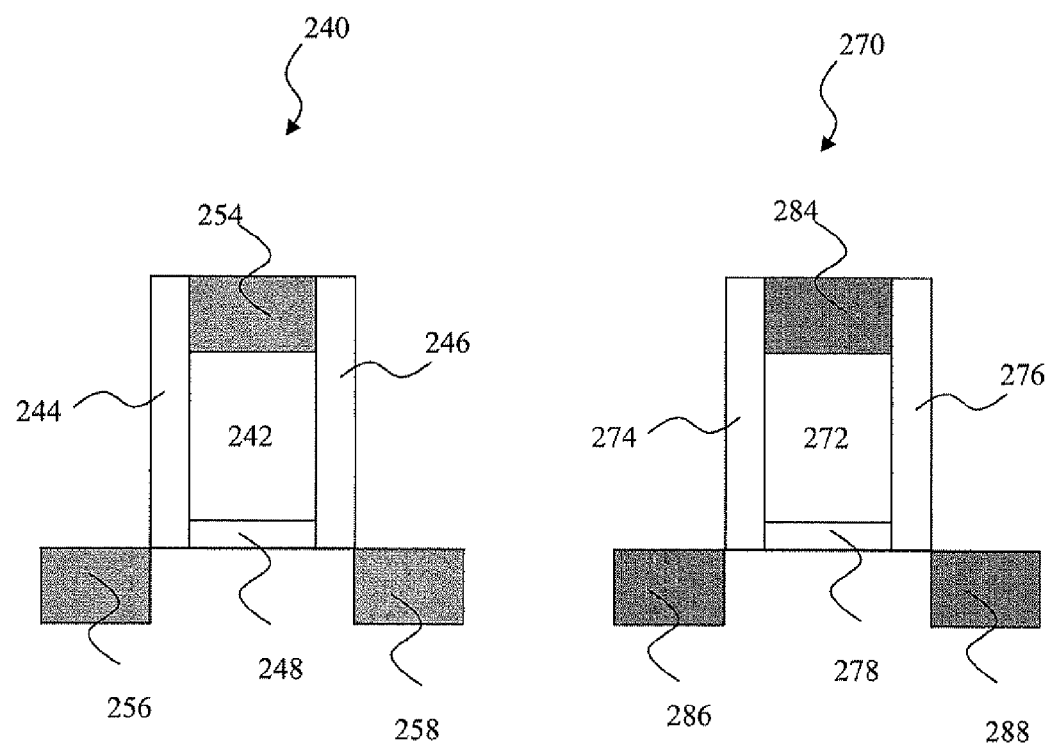

In step 218 and with additional reference to FIG. 2g, un-reacted metals may be removed from both the NMOS 240 and the PMOS 270, as well as other areas (not shown), such as an isolation structure. The metal that lies on isolation areas may not have reacted with an oxide or nitride layer, and may need to be selectively removed using a metal etching solution. Such etching may be completed in two steps, wherein each step may use a different etching solution and target for different metals. This will leave intact the silicide on the poly-silicon gate and source/drain contact areas. Generally, there is no lithography processing needed to pattern the metal silicide layers for contact because the silicide is aligned to the gate and source/drain areas by the selective reaction and etching (referred to as self-aligned silicide (salicide)).

Figure 3A:
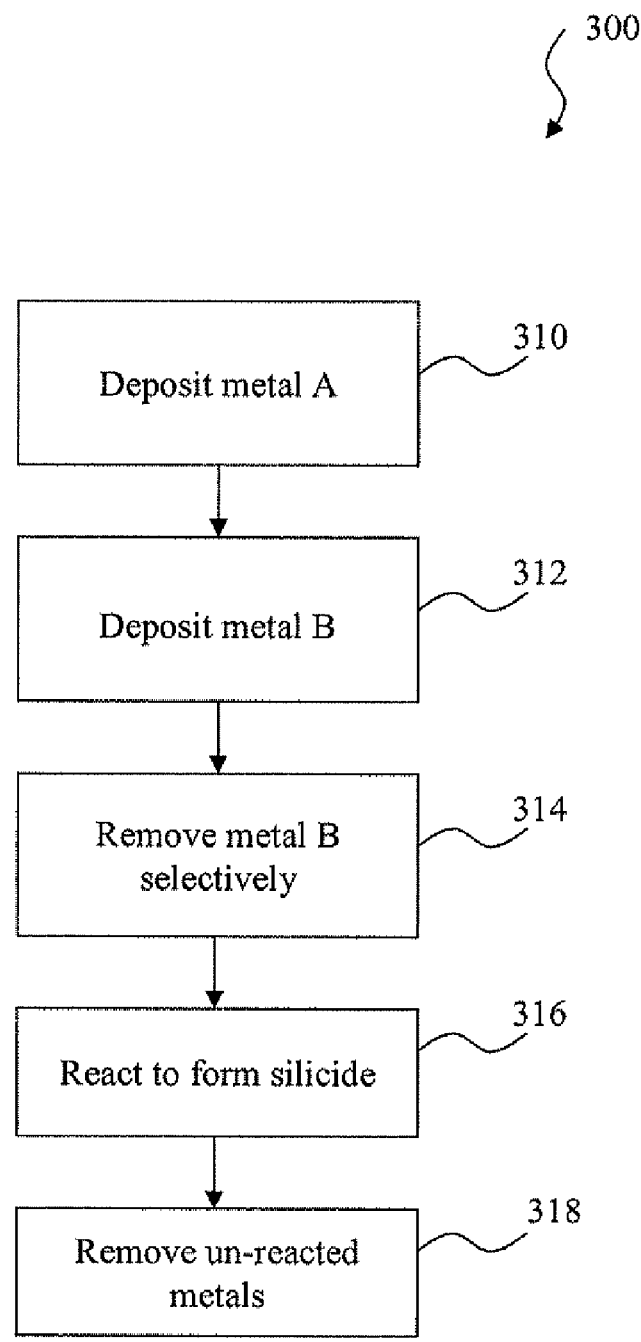
FIG. 3a is a flow chart illustrating a second exemplary method for fabricating the structure of FIG. 1.

Referring now to FIG. 3a and with additional reference to FIGS. 3b-3g, in another embodiment, a method 300 may be used to form the complementary silicide structure of FIG. 1 with an NMOS and a PMOS. FIGS. 3b-3g illustrate cross-sectional views of an exemplary integrated circuit undergoing fabrication steps that correspond to steps of FIG. 3a. As the method 300 of FIG. 3a is described below in greater detail, the cross-sectional views in FIGS. 3b-3g may also be referred to for purposes of illustration. It is understood that the method 300 is not limited to the formation of a complementary silicide structure, but may be used to form any two regions during a semiconductor fabrication process where the first region has one composition or material ratio and the second region has a different composition or material ratio.

Figure 3B:
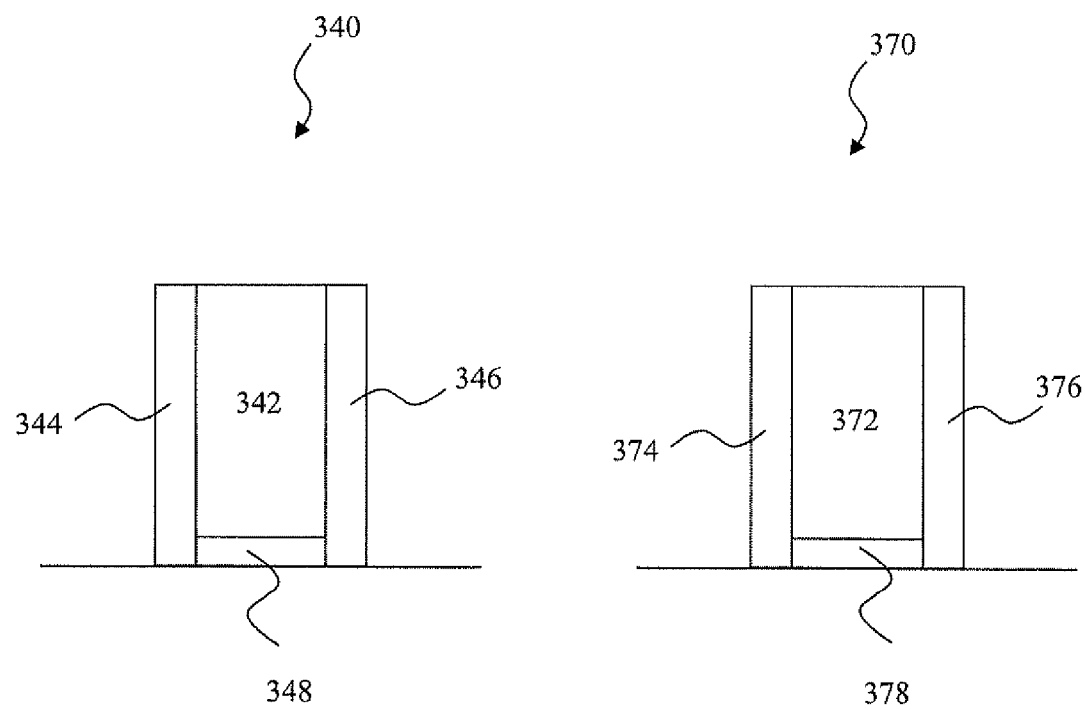

In the present example, the first region is an NMOS 340 and the second region is a PMOS 370, as illustrated in FIG. 3b. It is understood that portions of the NMOS 340 and PMOS 370 may be fabricated prior to the execution of the method 300. For example, the NMOS 340 includes a gate electrode 342, spacers 344 and 346, and a gate dielectric 348. The PMOS 370 includes a gate electrode 372, spacers 374 and 376, and a gate dielectric 378.

Figure 3C:
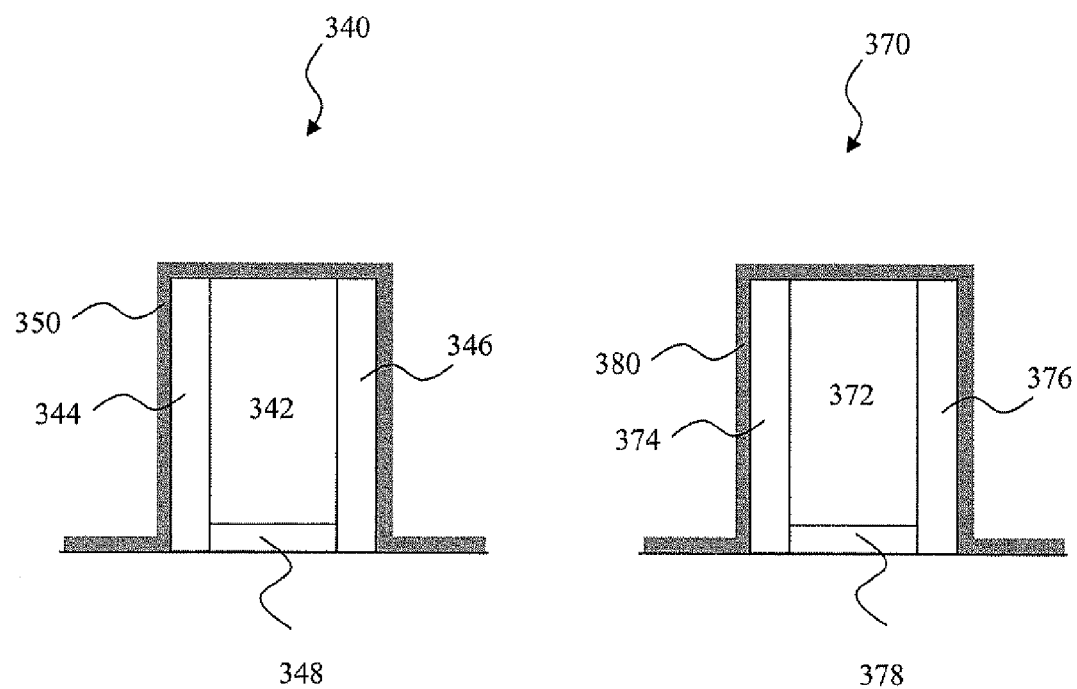

With specific reference now to FIGS. 3a and 3c, the method 300 begins in step 310 with the deposition of first metal portions 350, 380 (which are formed using the same metal 'A') over the NMOS 340 and PMOS 370, respectively. The first metal portions 350, 380 may be deposited using PVD or CVD processes. The first metal portions 350, 380 may be nickel, cobalt, tungsten, tantalum, titanium, platinum, erbium, palladium, or any other metal able to interact with silicon at an elevated temperature to form silicide in a low resistance phase state. In the present example, the first metal portions 350, 380 comprise nickel. The nickel may be deposited by nickel sputtering, with a suitable process flow including HF dipping, an argon pre-sputter etch to prepare the surface, and then nickel sputtering.

Figure 3D:
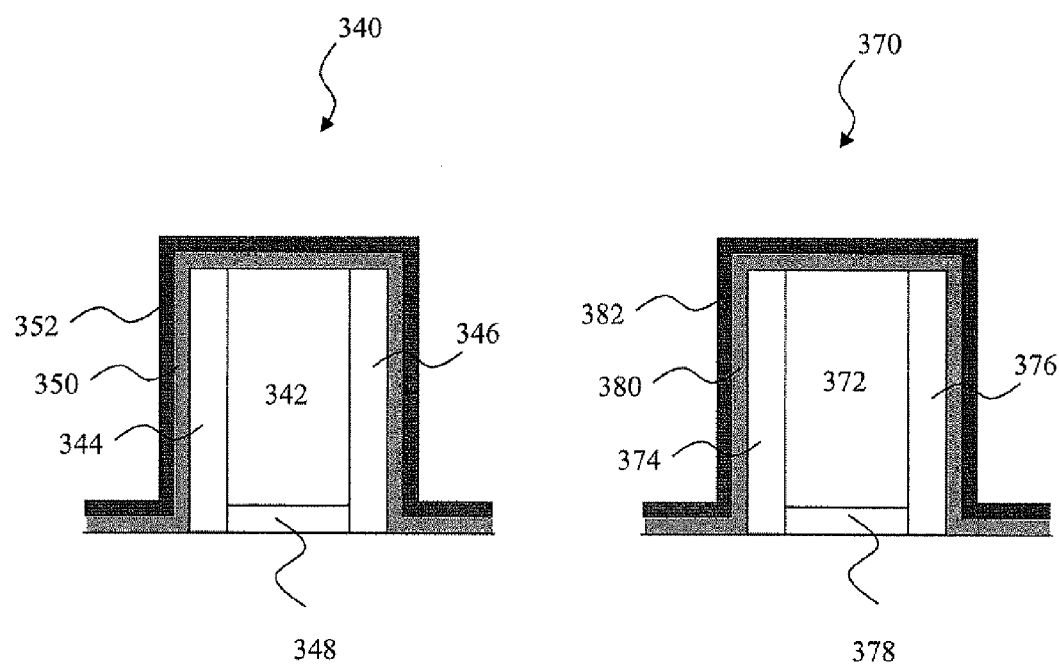

In step 312 and with additional reference to FIG. 3d, second metal portions 352, 382 are deposited over the NMOS 340 and PMOS 370, respectively. The second metal portions 352, 382 are formed using the same metal (metal 'B'), but it is a different metal or metal composition than that used to form the first metal portions 350, 380. The deposition process may use PVD or CVD. The second metal portions 352, 382 may comprise nickel, cobalt, tungsten, tantalum, titanium, platinum, erbium, palladium, or any other metal able to interact with silicon at an elevated temperature to form silicide in a low resistance phase state. In the present example, the second metal portions 352, 382 are cobalt.

Figure 3E:
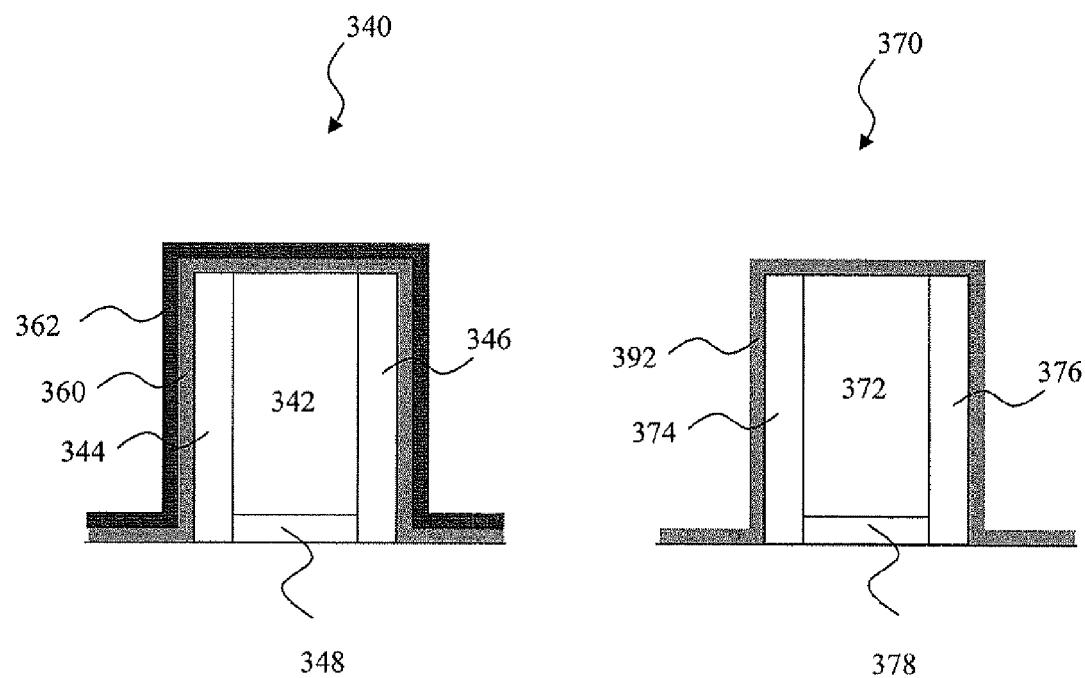

In step 314 and with additional reference to FIG. 3e, the second metal portion 382 may be removed selectively, leaving the second metal portion 352 intact. The second metal portion 382 may be selectively removed using such processes as photolithography and etching. Such processes may include forming photo-resist on both metal portions 352 and 382, transferring the etching pattern from a mask to the photo-resist, etching, and stripping. Alternatively, the etching may follow the stripping. It may be preferable to select the etching process based on the composition of the second metal portion 382.

Figure 3F:
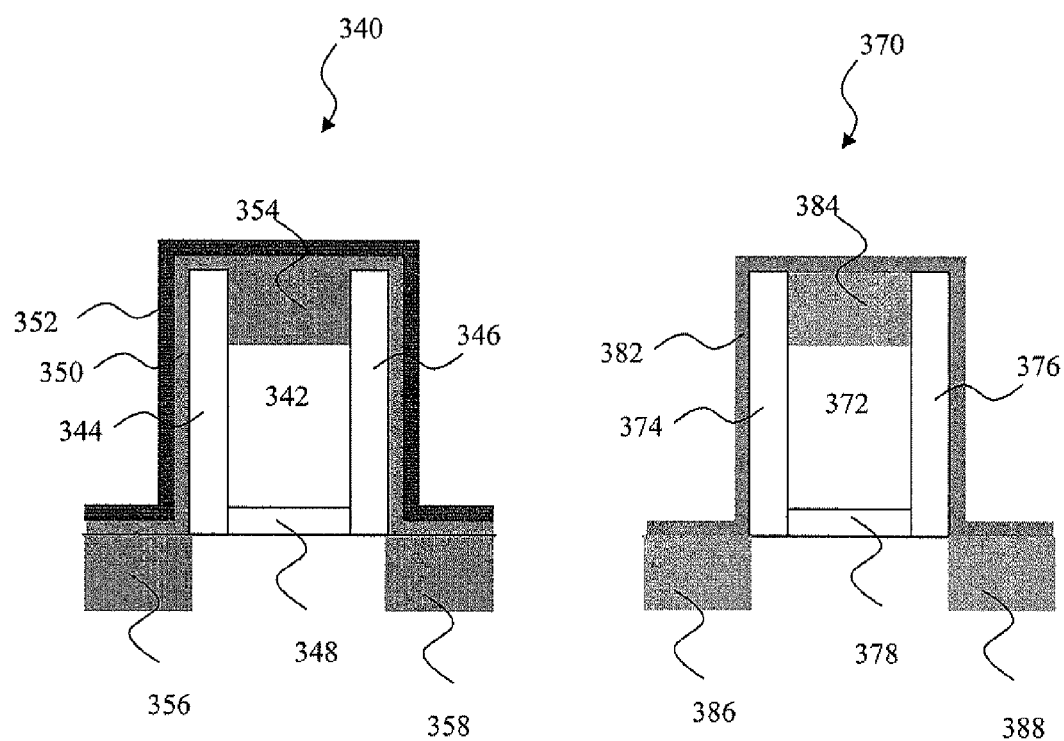

In step 316 and with additional reference to FIG. 3f, a silicide is formed on both the NMOS 340 and the PMOS 370. However, the silicide formed on the NMOS 340 is different than the silicide formed the PMOS 370. This is because the silicide formed on the NMOS 340 is an alloy silicide that contains both first metal portion 350 (nickel) silicide and second metal portion 352 (cobalt) silicide, while silicide formed on the PMOS 370 contains only second metal portion 382 (cobalt) silicide.

As illustrated in FIG. 3f, silicide formed on the gate, source, drain of the NMOS 340 produces gate silicide 354, source silicide 356, and drain silicide 358. Silicide formed on the gate, source, and drain of the PMOS 370 produces gate silicide 384, source silicide 386, and drain silicide 388. The gate silicide 354, source silicide 356, and drain silicide 358 are alloy silicides (nickel and cobalt), while the gate silicide 384, source silicide 386, and drain silicide 388 are cobalt silicide. The A/B metal (e.g., nickel/cobalt) ratio in the alloy silicide may be adjusted to provide a desired work function by optimizing metal deposition processing and silicidation processing. Silicidation processing may a reaction between the second metal (or first and second metals) and silicon (or poly-silicon) at an elevated temperature that is selected based on the specific metal or metals. Such reacted silicide may be in metastable phase and may need a second annealing step or RTA, thereby forming a stable silicide phase with reduced resistance. Such a second annealing step may also be implemented after step 318 (described below) which removes un-reacted metal. It is understood that some silicides, such as nickel silicide, may be formed in a one step RTA at a lower temperature.

Figure 3G:
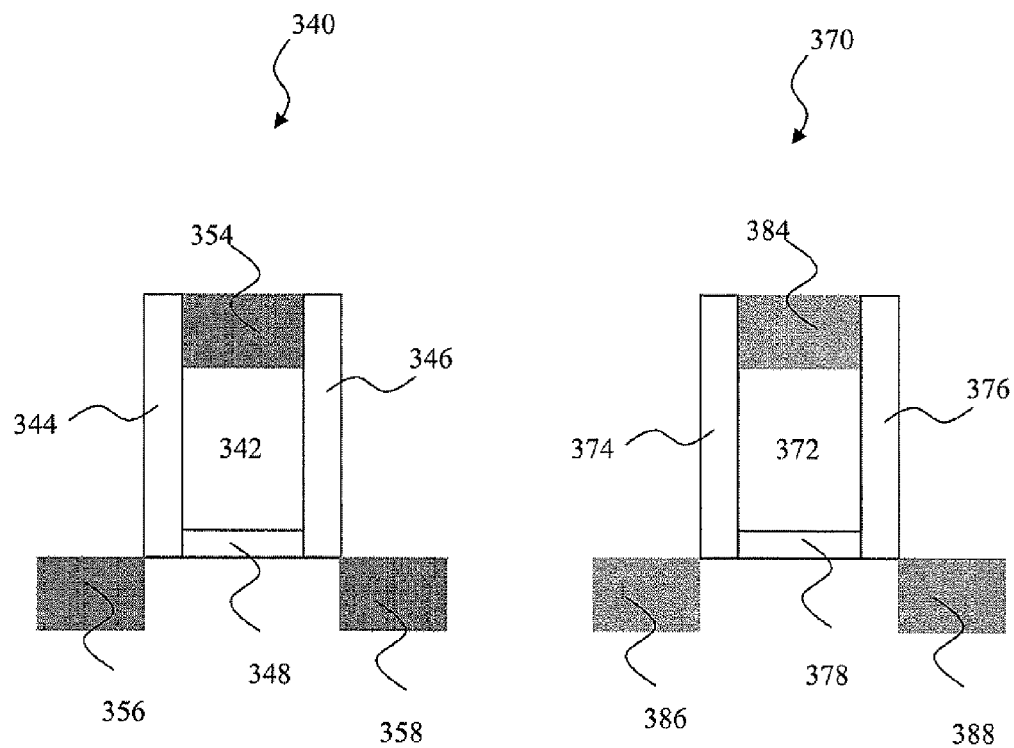

In step 318 and with additional reference to FIG. 3g, un-reacted metals may be removed from both the NMOS 340 and the PMOS 370, as well as other areas (not shown), such as an isolation structure. The metal that lies on isolation areas may not have reacted with an oxide or nitride layer, and may need to be selectively removed using a metal etching solution. This will leave intact the silicide on the polysilicon gate and source/drain contact areas. Generally, there is no lithography processing needed to pattern the metal silicide layers for contact because the silicide is a self-aligned silicide.

Figure 4A:
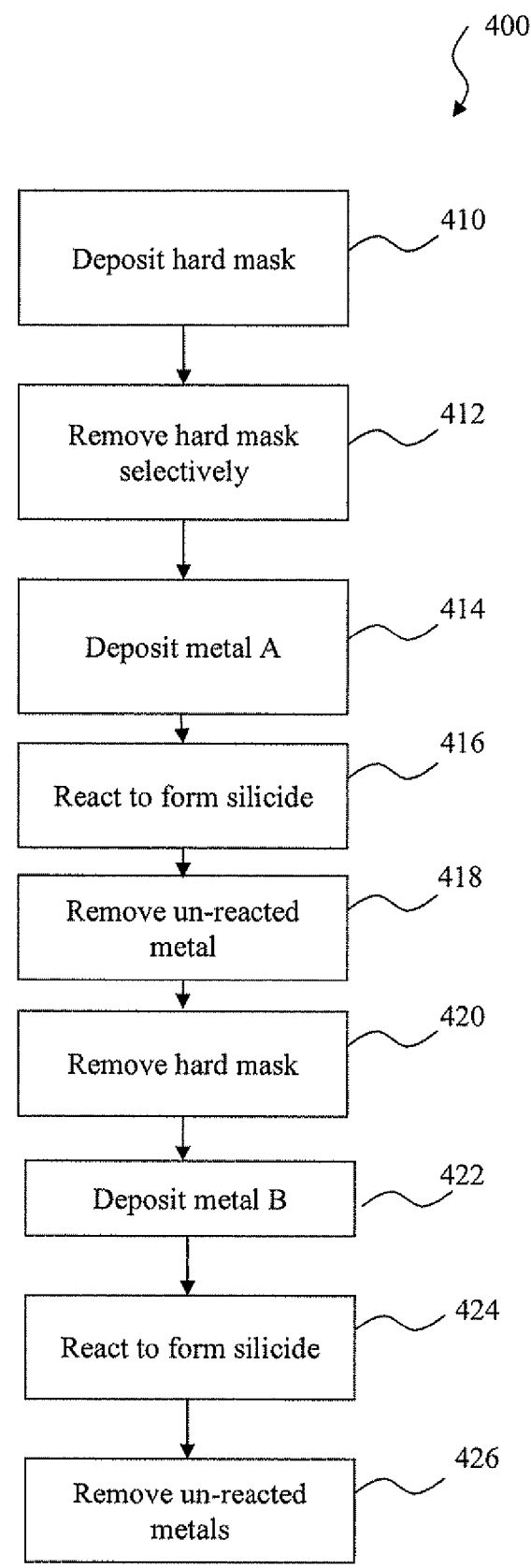
FIG. 4a is a flow chart illustrating a third exemplary method for fabricating the structure of FIG. 1.

Referring now to FIG. 4a and with additional reference to FIGS. 4b-4k, in yet another embodiment, a method 400 may be used to form the complementary silicide structure of FIG. 1 with an NMOS and a PMOS. FIGS. 4b-4k illustrate cross-sectional views of an exemplary integrated circuit undergoing fabrication steps that correspond to steps of FIG. 4a. As the method 400 of FIG. 4a is described below in greater detail, the cross-sectional views in FIGS. 4b-4k may also be referred to for purposes of illustration. It is understood that the method 400 is not limited to the formation of a complementary silicide structure, but may be used to form any two regions during a semiconductor fabrication process where the first region has one composition or material ratio and the second region has a different composition or material ratio.

Figure 4B:
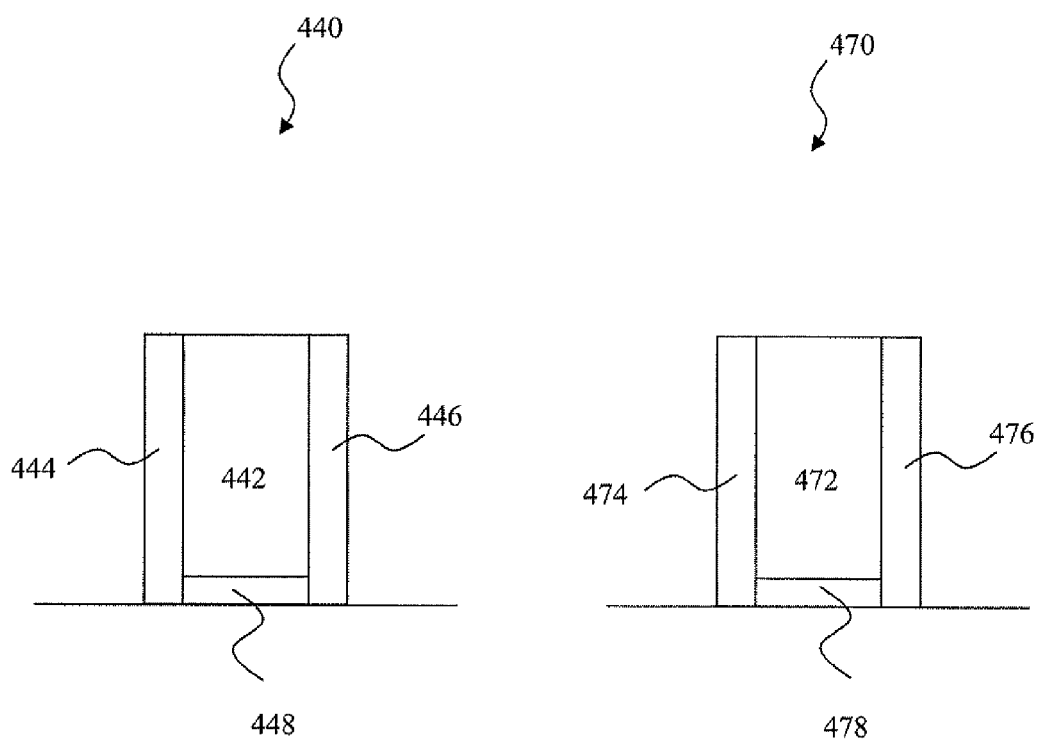

In the present example, the first region is an NMOS 440 and the second region is a PMOS 470, as illustrated in FIG. 4b. It is understood that portions of the NMOS 440 and PMOS 470 may be fabricated prior to the execution of the method 400. For example, the NMOS 440 includes a gate electrode 442, spacers 444 and 446, and a gate dielectric 448. The PMOS 470 includes a gate electrode 472, spacers 474 and 476, and a gate dielectric 478.

Figure 4C:
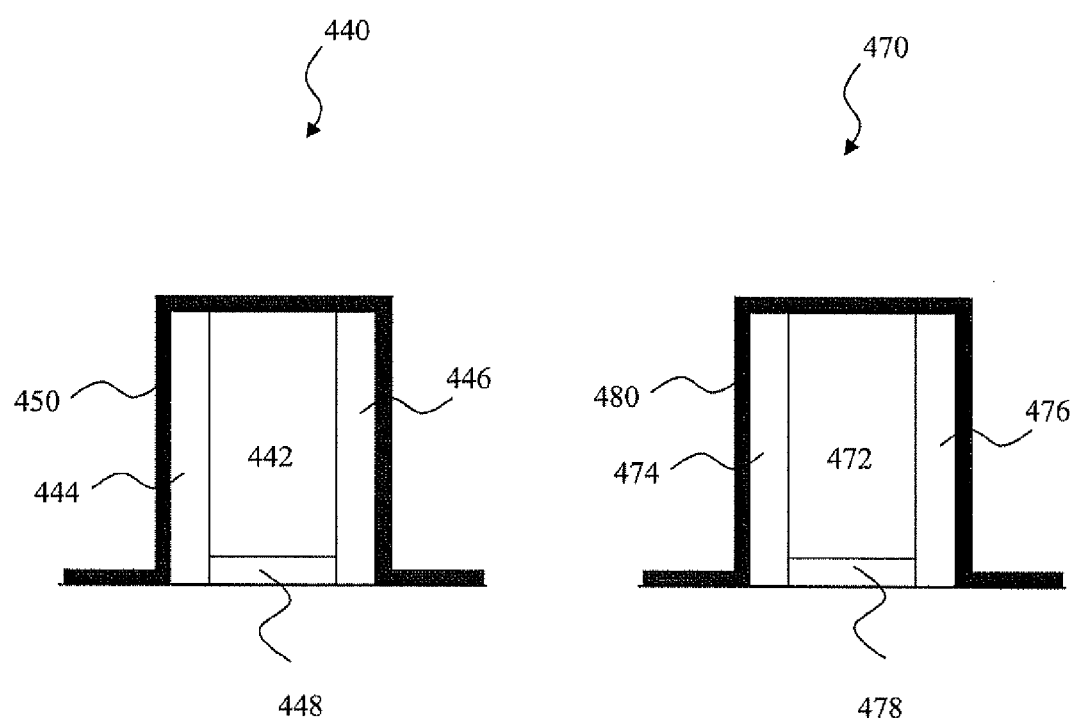

With specific reference now to FIGS. 4a and 4c, the method 400 begins in step 410 with the deposition of hard mask portions 450, 480 over the NMOS 440 and PMOS 470, respectively. The hard mask portions 450, 480 may be deposited using PVD processes, CVD processes, or a high temperature interaction between nitrogen or oxygen gases. The hard mask portions 450, 480 may include silicon oxide, silicon nitride, silicon carbide, or a combination thereof. For example, silicon nitride may be formed by high temperature CVD, LPCVD, or PECVD. LPCVD silicon nitride may be formed by reacting dichlorosilane ($SiCl_2H_2$) and ammonia ($NH_3$). Silicon oxide may be formed by thermal oxidation or CVD processes. Silicon carbide may be formed based on PECVD using trimeththylsilane.

Figure 4D:
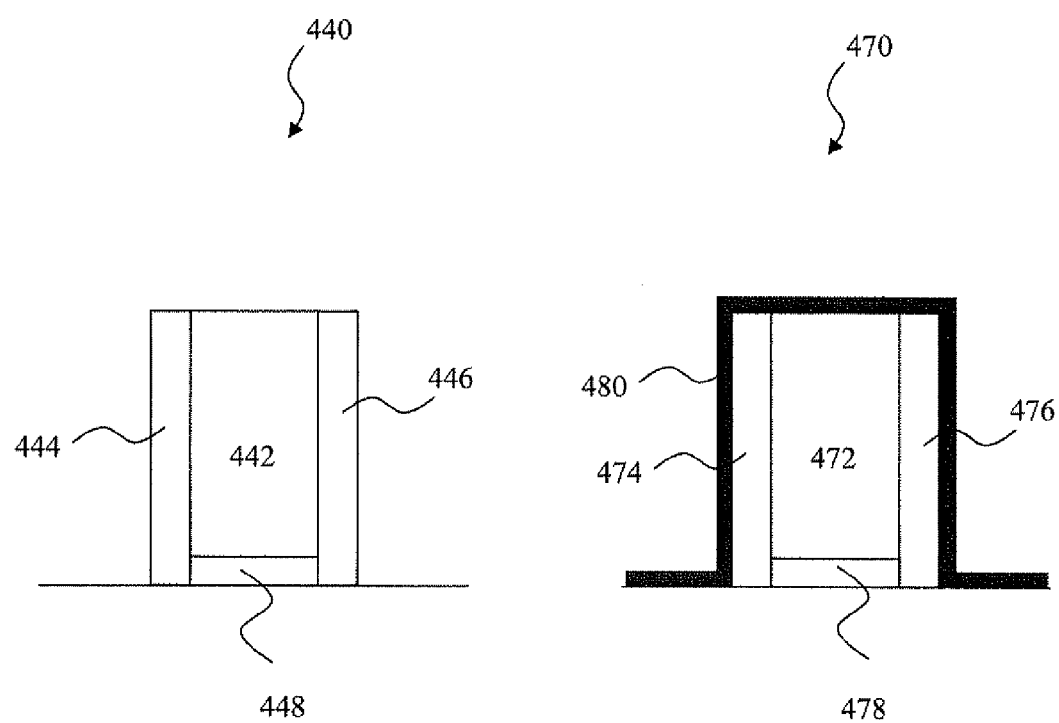

In step 412 and with additional reference to FIG. 4d, the hard mask portion 450 may be removed selectively, leaving the hard mask portion 480 intact. The hard mask portion 450 may be selectively removed using such processes as photolithography and etching that are well know in the art. Such processes may include forming photo-resist on both hard mask portions 450 and 480, transferring the etching pattern from a mask to the photo-resist, etching, and stripping. Alternatively, the etching may follow the stripping. It may be preferable to select the etching process based on the material forming the hard mask. For example, after the photo-resist is applied, exposed, and developed, a silicon nitride hard mask may be dry etched according to a pre-designed pattern transferred from an optical mask to the photo-resist.

Figure 4E:
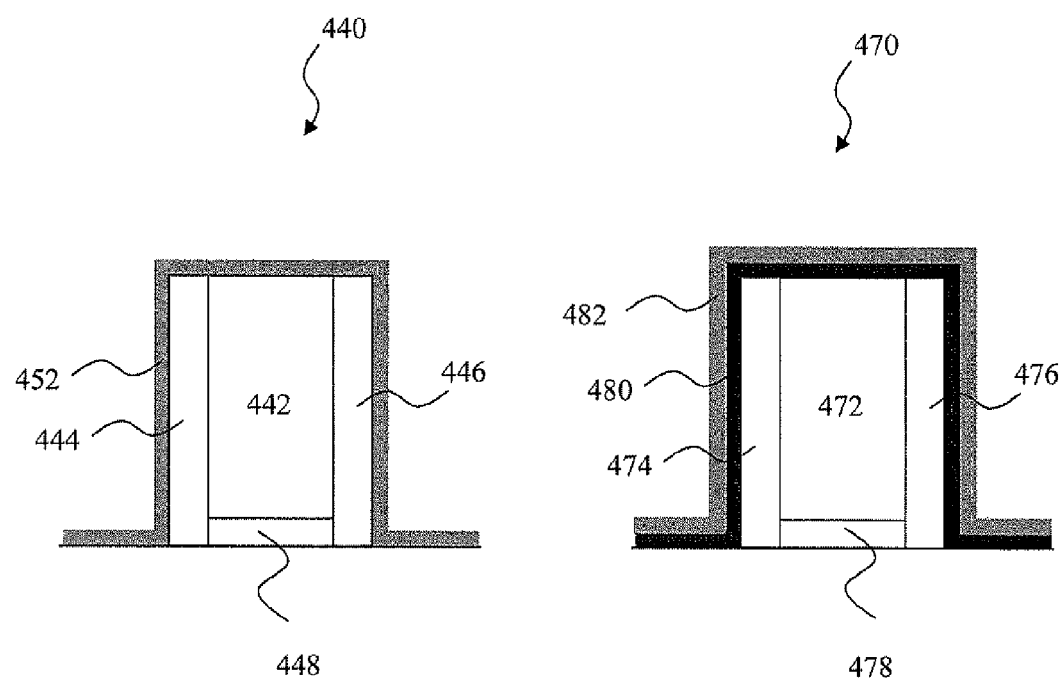

In step 414 and with additional reference to FIG. 4e, first metal portions 452, 482 are deposited over the NMOS 440 and PMOS 470, respectively. The first metal portions 452, 482 are formed using the same metal (metal 'A'). The deposition process may use PVD or CVD. The second metal portions 252, 282 may comprise nickel, cobalt, tungsten, tantalum, titanium, platinum, erbium, palladium, or any other metal able to interact with silicon at an elevated temperature to form silicide in a low resistance phase state. In the present example, the first metal portions 452, 482 are nickel.

Figure 4F:
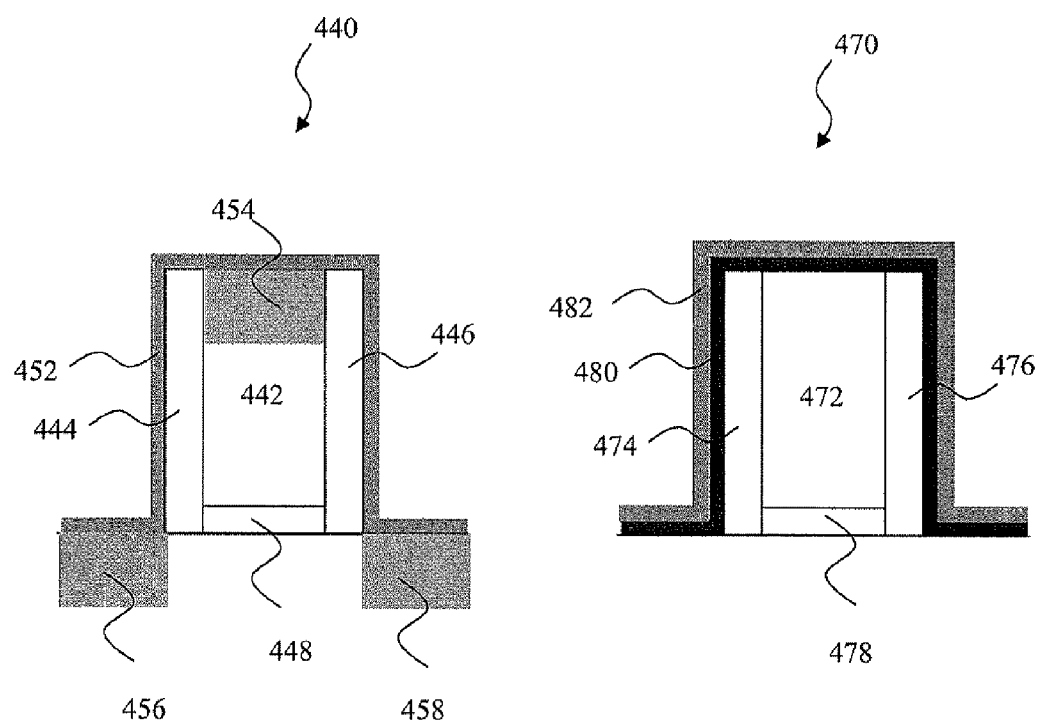

In step 416 and with additional reference to FIG. 4f, a silicide is formed on the NMOS 440. The silicide formed on the NMOS 240 contains only first metal portion 452 (e.g., metal A or nickel) silicide. However, because the PMOS 470 is covered by the hard mask portion 480, the metal A (nickel) that comprises the first metal portion 482 is unable to interact with the silicon or poly-silicon of the PMOS 470.

As shown in FIG. 4f, silicide formed on the gate, source, drain of the NMOS 340 produces gate silicide 454, source silicide 456, and drain silicide 458. Silicidation processing may be a reaction between metal A and silicon (or poly-silicon) at an elevated temperature that is selected based on the specific metal or metals. The silicidation process may include a second annealing step that anneals reacted silicide in metastable phase and forms a stable silicide phase with reduced resistance. Such a second annealing step may also be implemented after step 418 (described below), which removes un-reacted metal. It is understood that some silicides, such as nickel silicide, may be formed in a one step RTA at a lower temperature.

Figure 4G:
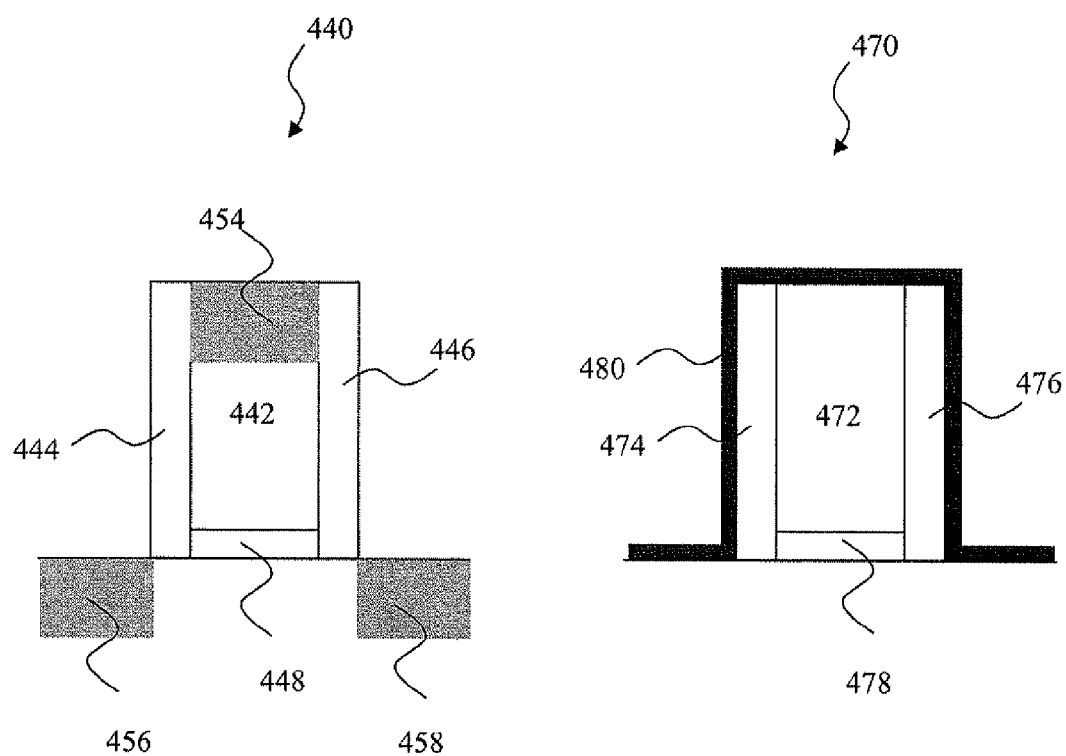

In step 418 and with additional reference to FIG. 4g, un-reacted metals may be removed from both the NMOS 440 and the PMOS 470, as well as other areas such as an isolation structure (not shown). The un-reacted metal associated with the NMOS 440 comprises the residuals of metal A after the silicidation of step 416. Metal associated with isolation areas, nitride/oxide spacers, and the PMOS 470 (which is covered by the hard mask) is not reacted with an oxide or nitride layer, and may be removed using a metal etching, leaving intact the silicide on the polysilicon gate and source/drain contact areas on the NMOS 440.

Figure 4H:
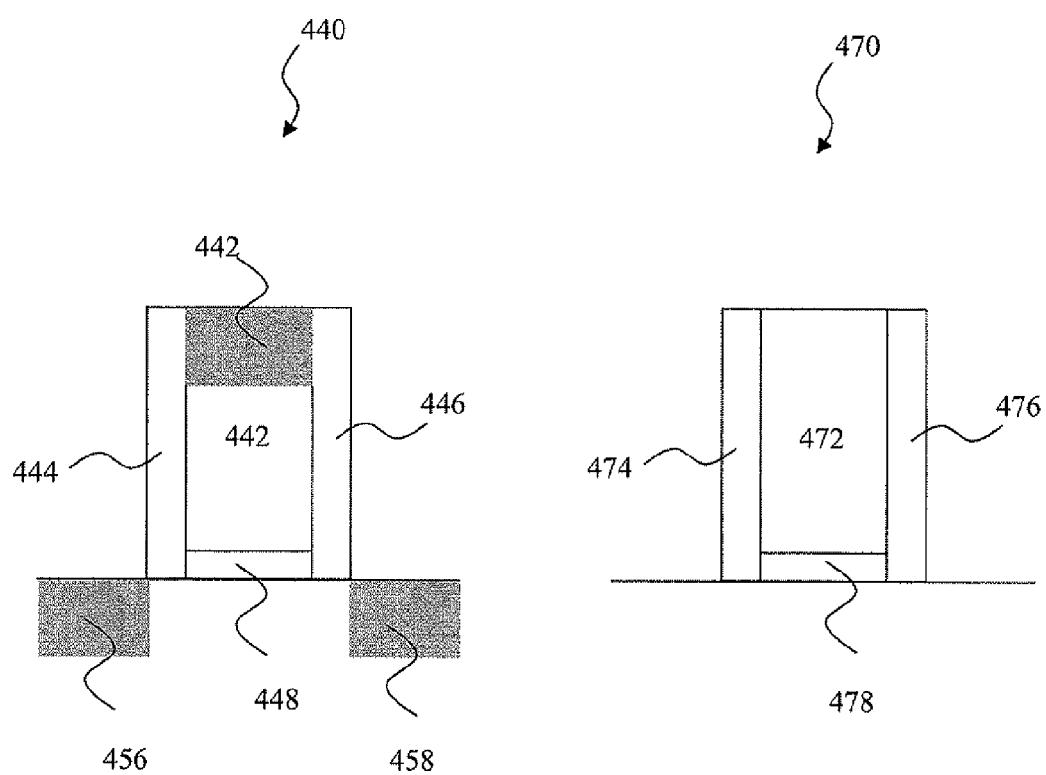

In step 420 and with additional reference to FIG. 4h, the hard mask portion 480 is removed from the PMOS 470. The hard mask portion 480 may be removed by an etching process, such as wet etching or dry etching. For example, in wet etching, an etching solution may be selected that has a high etching selectivity between silicon nitride and other materials, including silicon oxide and metal silicide.

Figure 4I:
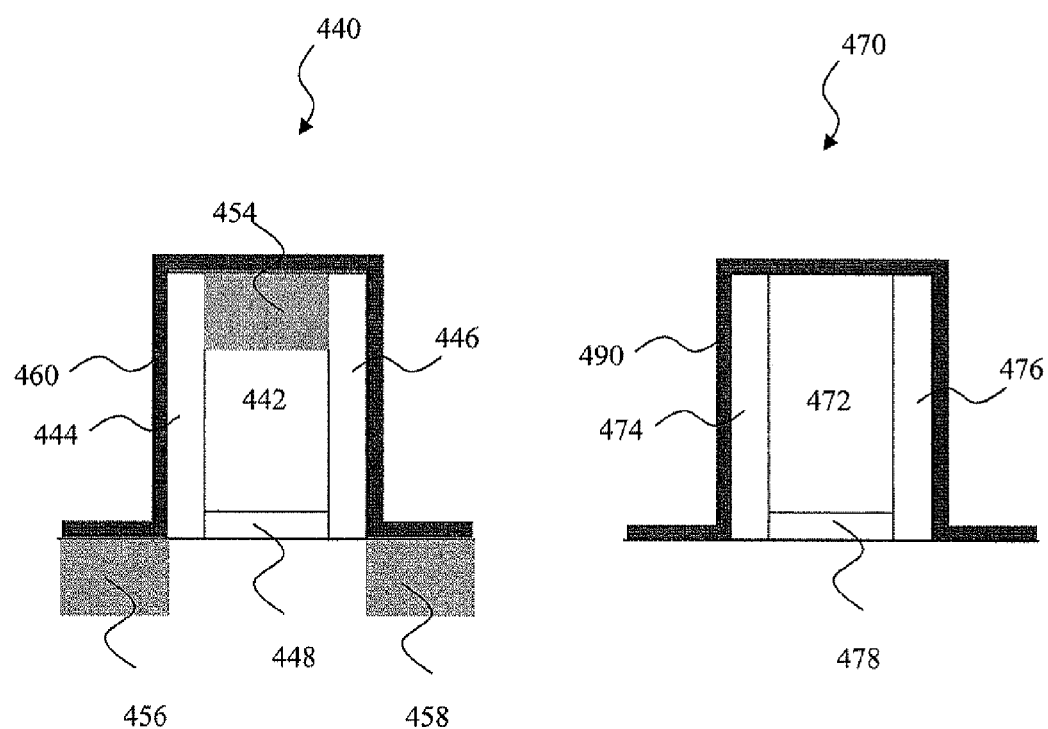

In step 422 and with additional reference to FIG. 4i, second metal portions 460, 490 are deposited over the NMOS 440 and PMOS 470, respectively. The second metal portions 460, 490 are formed using the same metal (metal 'B'), but it is a different metal or metal composition than that used to form the first metal portions 452, 482. The deposition process may use PVD or CVD. The second metal portions 460, 490 may comprise nickel, cobalt, tungsten, tantalum, titanium, platinum, erbium, palladium, or any other metal able to interact with silicon at an elevated temperature to form silicide in a low resistance phase state. In the present example, the second metal portions 460, 490 are cobalt.

Figure 4J:
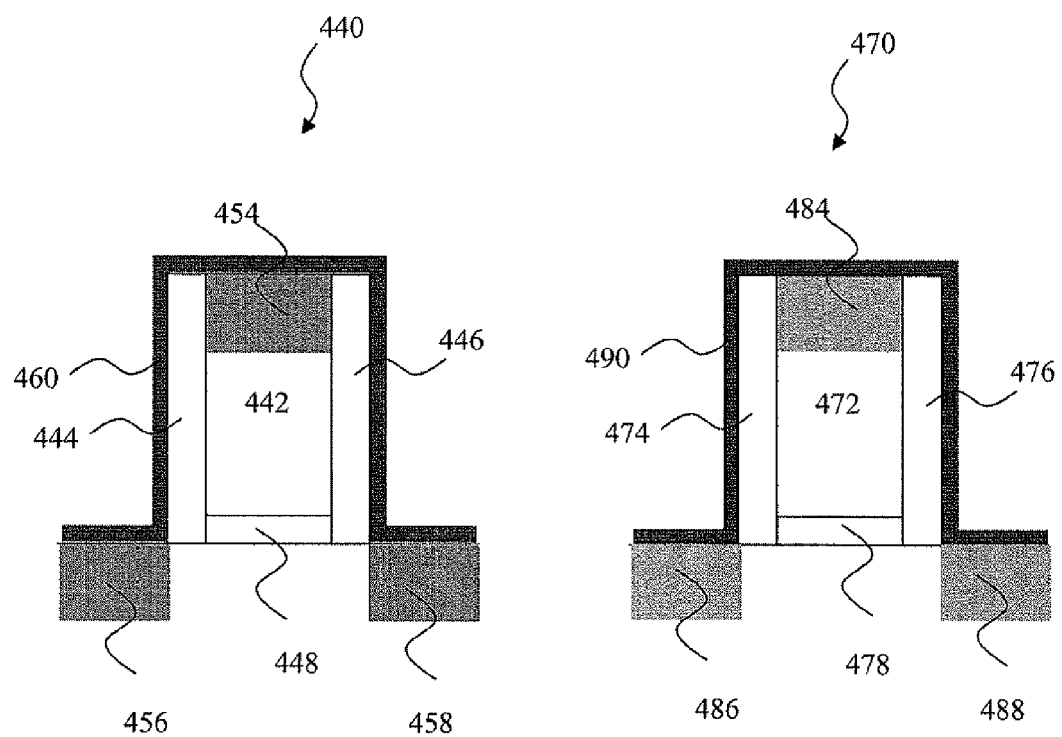

In step 424 and with additional reference to FIG. 4j, a silicide is formed on both the NMOS 440 and the PMOS 470. However, the silicide formed on the NMOS 440 is different than the silicide formed the PMOS 470. This is because the silicide formed on the NMOS 440 is an alloy silicide that contains both first metal portion 452 (e.g., metal A or nickel) silicide and second metal portion 460 (e.g., metal B or cobalt) silicide, while silicide formed on the PMOS 470 contains only second metal portion 490 (cobalt) silicide.

As illustrated in FIG. 4j, silicide formed on the gate, source, drain of the NMOS 440 produces gate silicide 454, source silicide 456, and drain silicide 458. Silicide formed on the gate, source, and drain of the PMOS 470 produces gate silicide 384, source silicide 486, and drain silicide 488. The gate silicide 454, source silicide 456, and drain silicide 458 are alloy silicides (nickel and cobalt), while the gate silicide 484, source silicide 486, and drain silicide 488 are cobalt silicides.

As previously described, the metal A silicide on the NMOS 440 was initially formed during step 416. In the current step 424, the metal A silicide on the NMOS 440 interacts with the metal B to form an alloy silicide. The A/B metal (e.g., nickel/cobalt) ratio in the alloy silicide may be adjusted to provide a desired work function by optimizing metal deposition processing and silicidation processing. Silicidation processing may a reaction between the second metal (or first and second metals) and silicon (or poly-silicon) at an elevated temperature that is selected based on the specific metal or metals. Such reacted silicide may be in metastable phase and may need a second annealing step or RTA, thereby forming a stable silicide phase with reduced resistance. Such a second annealing step may also be implemented after the step 318 (described below) which removes un-reacted metal. It is understood that some silicides, such as nickel silicide, may be formed in a one step RTA at a lower temperature.

Figure 4K:
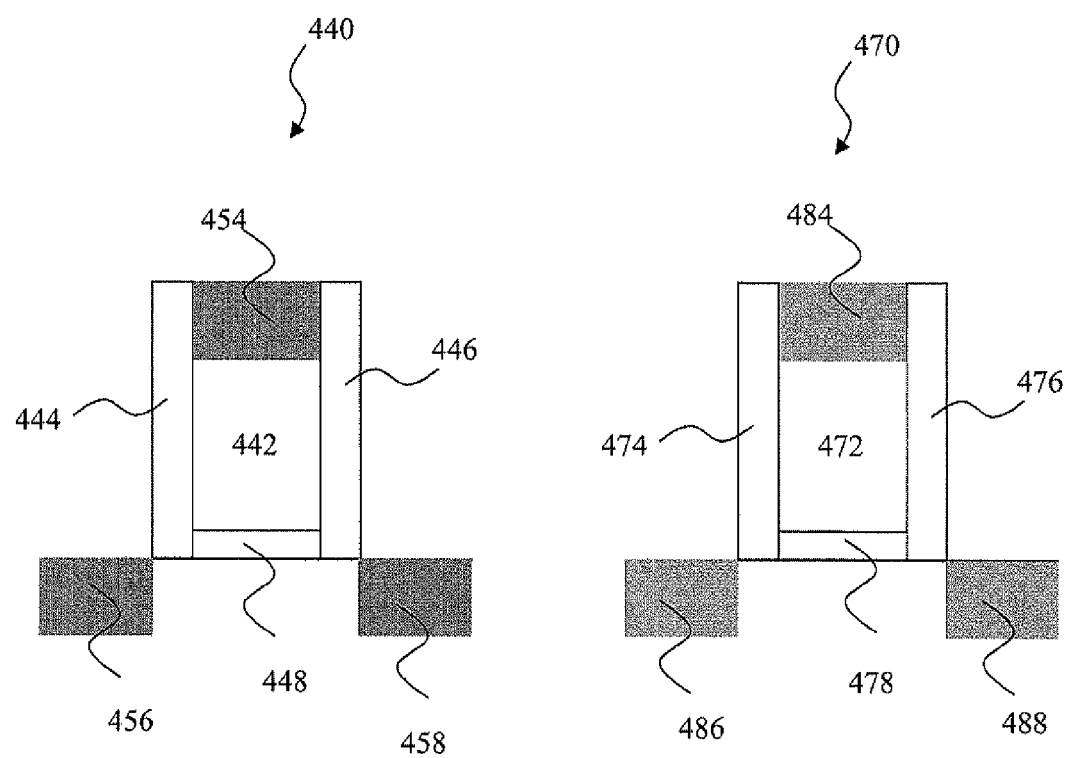

In step 426 and with additional reference to FIG. 4k, un-reacted metals may be removed from both the NMOS 440 and the PMOS 470, as well as other areas (not shown), such as an isolation structure. The metal that lies on isolation areas may not have reacted with an oxide or nitride layer, and may need to be selectively removed using a metal etching solution. This will leave intact the silicide on the polysilicon gate and source/drain contact areas.

Figure 5A:
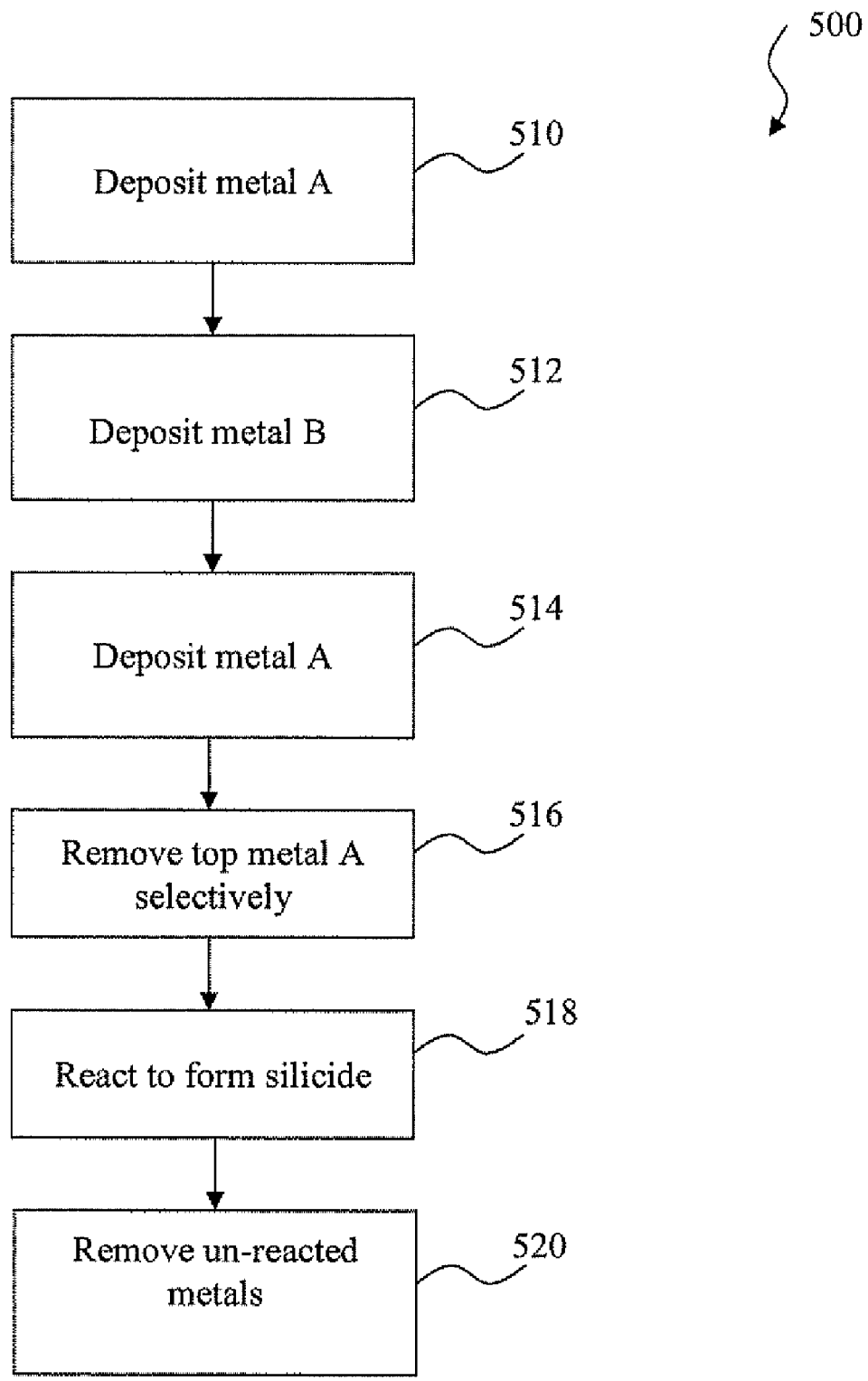
FIG. 5a is a flow chart illustrating a fourth exemplary method for fabricating the structure of FIG. 1.

Referring now to FIG. 5a and with additional reference to FIGS. 5b-5h, in still another embodiment, a method 500 may be used to form the complementary silicide structure of FIG. 1 with an NMOS and a PMOS. FIGS. 5b-5h illustrate cross-sectional views of an exemplary integrated circuit undergoing fabrication steps that correspond to steps of FIG. 5a. As the method 500 of FIG. 5a is described below in greater detail, the cross-sectional views in FIGS. 5b-5h may also be referred to for purposes of illustration. It is understood that the method 500 is not limited to the formation of a complementary silicide structure, but may be used to form any two regions during a semiconductor fabrication process where the first region has one composition or material ratio and the second region has a different composition or material ratio.

Figure 5B:
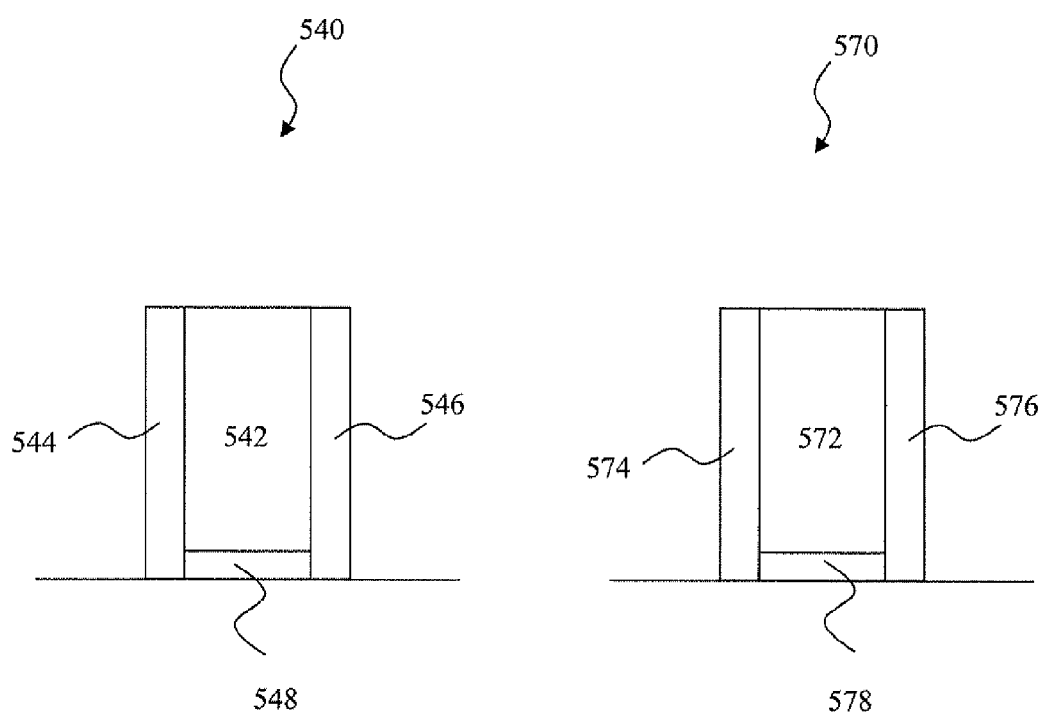

In the present example, the first region is an NMOS 540 and the second region is a PMOS 570, as illustrated in FIG. 5b. It is understood that portions of the NMOS 540 and PMOS 570 may be fabricated prior to the execution of the method 500. For example, the NMOS 540 includes a gate electrode 542, spacers 544 and 546, and a gate dielectric 548. The PMOS 570 includes a gate electrode 572, spacers 574 and 576, and a gate dielectric 578.

Figure 5C:
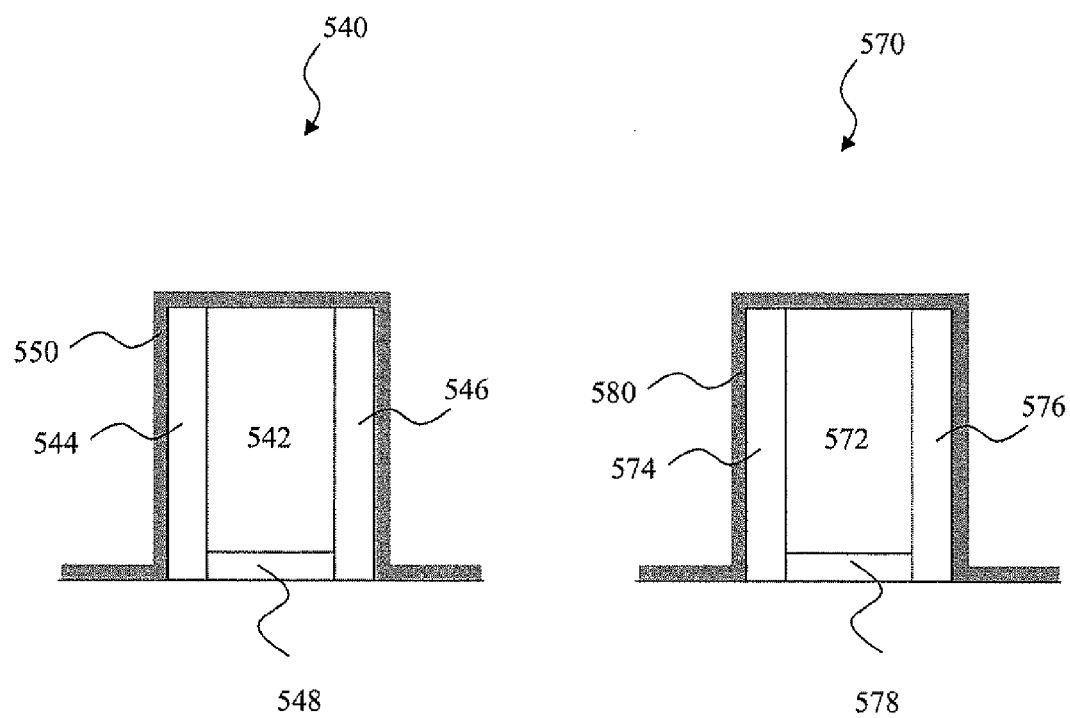

With specific reference now to FIGS. 5a and 5c, the method 500 begins in step 510 with the deposition of first metal portions 550, 580 (which are formed using the same metal 'A') over the NMOS 540 and PMOS 570, respectively. The first metal portions 550, 580 may be deposited using PVD or CVD processes. The first metal portions 550, 580 may be nickel, cobalt, tungsten, tantalum, titanium, platinum, erbium, palladium, or any other metal able to interact with silicon at an elevated temperature to form silicide in a low resistance phase state. In the present example, the first metal portions 550, 580 comprise nickel. The nickel may be deposited by nickel sputtering, with a suitable process flow including HF dipping, an argon pre-sputter etch to prepare the surface, and then nickel sputtering.

Figure 5D:
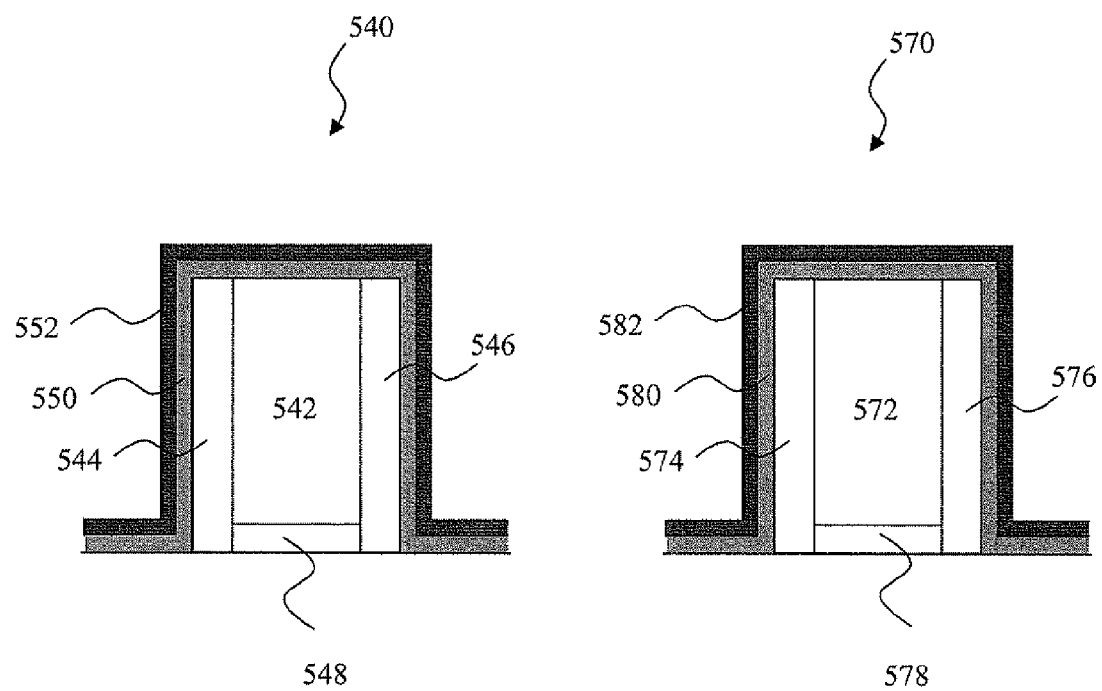

In step 512 and with additional reference to FIG. 5d, second metal portions 552, 582 are deposited over the NMOS 540 and PMOS 570, respectively. The second metal portions 552, 582 are formed using the same metal (metal 'B'), but it is a different metal or metal composition than that used to form the first metal portions 550, 580. The deposition process may use PVD or CVD. The second metal portions 552, 582 may comprise nickel, cobalt, tungsten, tantalum, titanium, platinum, erbium, palladium, or any other metal able to interact with silicon at an elevated temperature to form silicide in a low resistance phase state. In the present example, the second metal portions 552, 582 are cobalt.

Figure 5E:
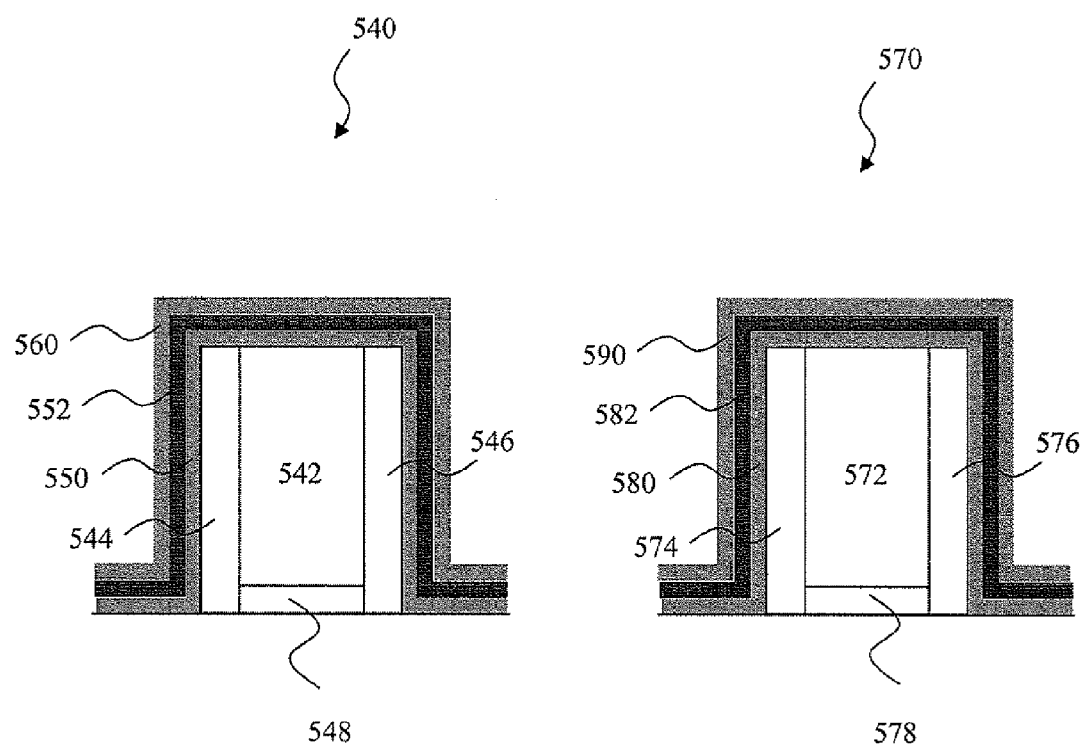

In step 514 and with additional reference to FIG. 5e, third metal portions 560, 590 are deposited over the NMOS 540 and PMOS 570, respectively. The third metal portions 560, 590 are formed using the same metal ('A') as the first metal portions 550, 580. This forms a "sandwich" structure with a layer of metal B formed between two layers of metal A (e.g., nickel/cobalt/nickel). The deposition process may use PVD or CVD. The third metal portions 560, 590 may comprise nickel, cobalt, tungsten, tantalum, titanium, platinum, erbium, palladium, or any other metal able to interact with silicon at an elevated temperature to form silicide in a low resistance phase state. In the present example, the third metal portions 560, 590 are nickel. The nickel may be deposited by a process such as nickel sputtering, with a suitable process flow including HF dipping, an argon pre-sputter etch to prepare the surface, and then nickel sputtering.

Figure 5F:
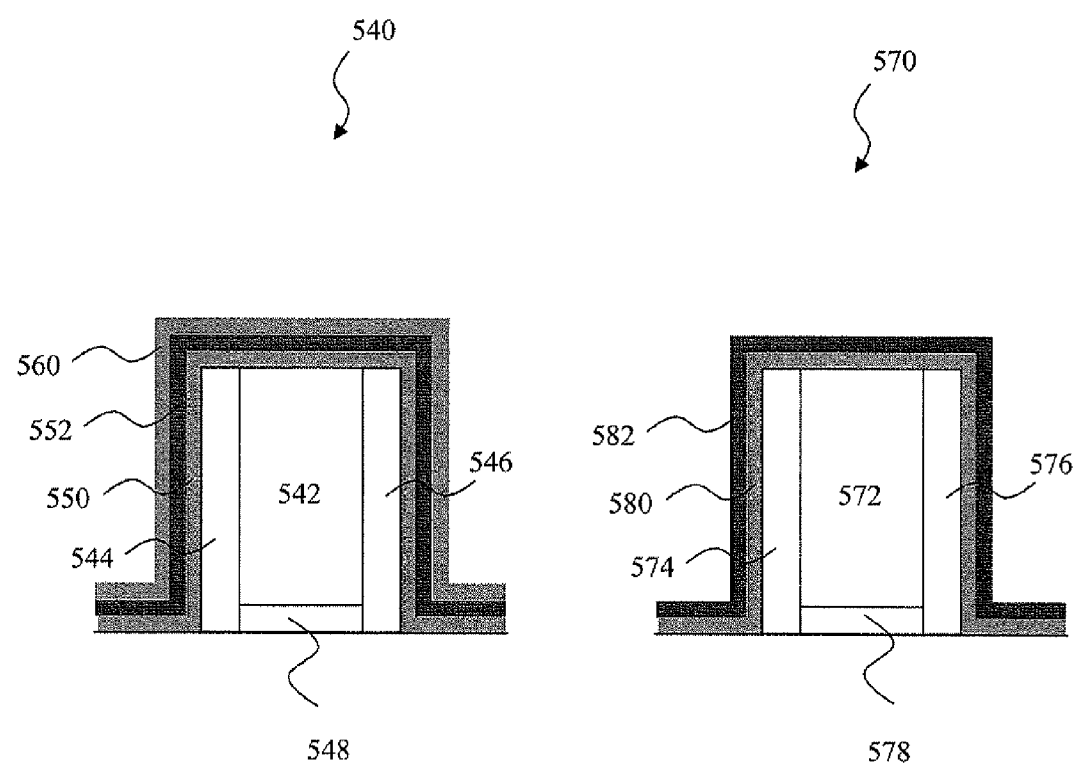

In step 516 and with additional reference to FIG. 5f, the third metal portion 590 may be removed selectively, leaving the third metal portion 560 intact. The third metal portion 590 may be selectively removed using such processes as photolithography and etching. Such processes may include forming photo-resist on both metal portions 560 and 590, transferring an etching pattern from a mask to the photo-resist, etching, and stripping. Alternatively, the etching may follow the stripping. It may be preferable to select the etching process based on the third metal portion 590. For example, if the material is nickel, a wet etching process may be selected using a metal etching solution such as a sulfuric peroxide mixture.

Figure 5G:
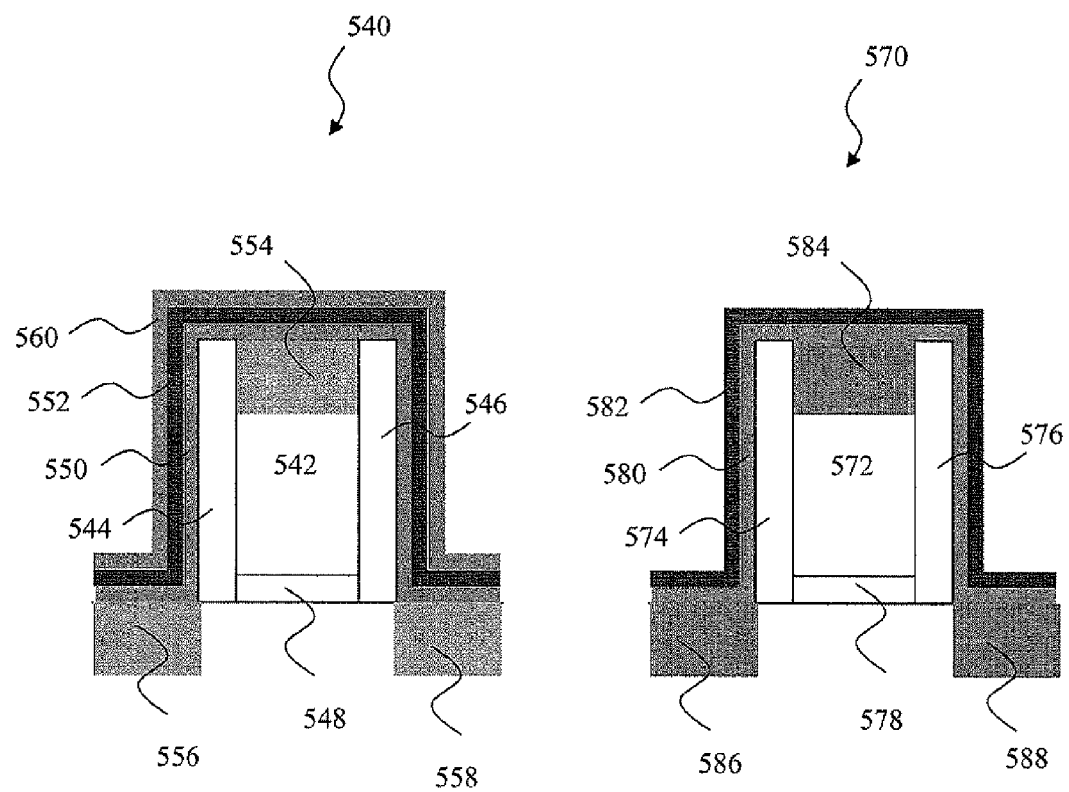

In step 518 and with additional reference to FIG. 5g, a silicide is formed on both the NMOS 540 and the PMOS 570. However, the silicide formed on the NMOS 540 is different than the silicide formed the PMOS 570. This is because the silicide formed on the NMOS 540 is an alloy silicide that contains a relatively large amount of metal A (e.g., nickel), while silicide formed on the PMOS 570 contains a lesser amount of metal A. In other words, both are alloy silicides containing metals A and B (e.g., nickel and cobalt), but with different compositions.

As illustrated in FIG. 5g, silicide formed on the gate, source, drain of the NMOS 540 produces gate silicide 554, source silicide 556, and drain silicide 558. Silicide formed on the gate, source, and drain of the PMOS 570 produces gate silicide 584, source silicide 586, and drain silicide 588. The gate silicide 554, source silicide 556, and drain silicide 558 are alloy silicides with a relatively high level of metal A (nickel), while the gate silicide 584, source silicide 586, and drain silicide 588 are alloy silicides with a lower level of metal A. The A/B metal (e.g., nickel/cobalt) ratio in the alloy silicides may be adjusted to provide a desired work function by optimizing metal deposition processing and silicidation processing. Silicidation processing may a reaction between the second metal (or first and second metals) and silicon (or poly-silicon) at an elevated temperature that is selected based on the specific metal or metals. Such reacted silicide may be in metastable phase and may need a second annealing step or RTA, thereby forming a stable silicide phase with reduced resistance. Such a second annealing step may also be implemented after the step 520 (described below) which removes un-reacted metal. It is understood that some silicides, such as nickel silicide, may be formed in a one step RTA at a lower temperature.

Figure 5H:
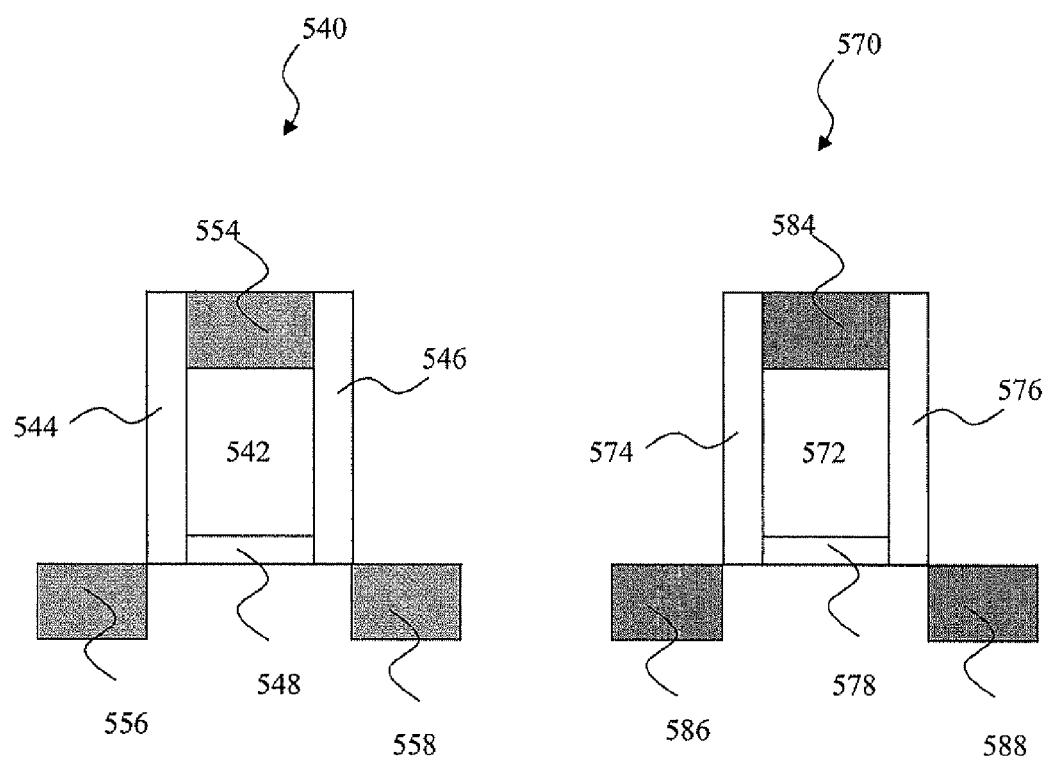

In step 520 and with additional reference to FIG. 5h, un-reacted metals may be removed from both the NMOS 540 and the PMOS 570, as well as other areas (not shown), such as an isolation structure. The metal that lies on isolation areas may not have reacted with an oxide or nitride layer, and may need to be selectively removed using a metal etching solution. This will leave intact the silicide on the polysilicon gate and source/drain contact areas.

Figure 6A:
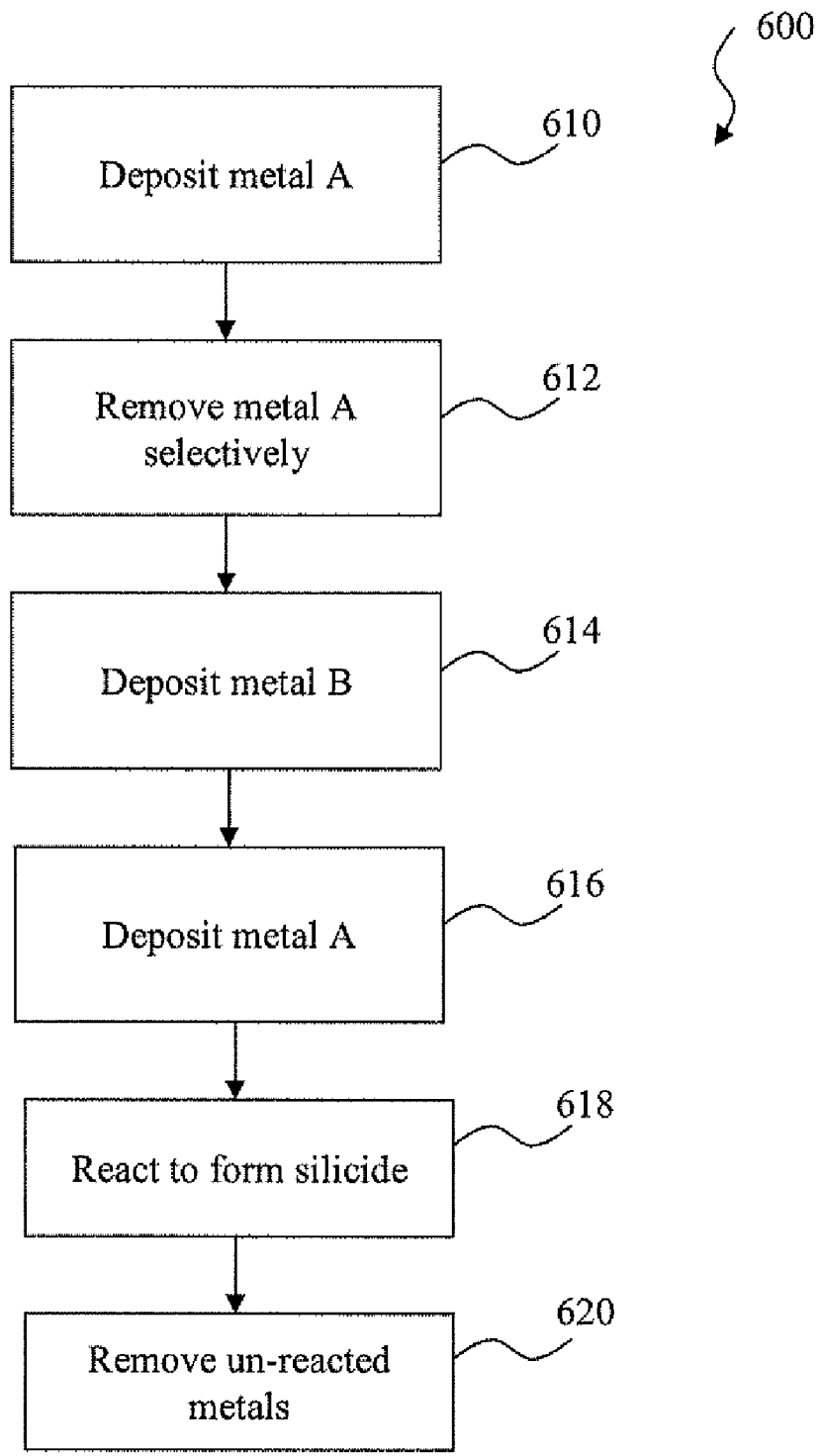
FIG. 6a is a flow chart illustrating a fifth exemplary method for fabricating the structure of FIG. 1.

Referring now to FIG. 6a and with additional reference to FIGS. 6b-6h, in another embodiment, a method 600 may be used to form the complementary silicide structure of FIG. 1 with an NMOS and a PMOS. FIGS. 6b-6h illustrate cross-sectional views of an exemplary integrated circuit undergoing fabrication steps that correspond to steps of FIG. 6a. As the method 600 of FIG. 6a is described below in greater detail, the cross-sectional views in FIGS. 6b-6h may also be referred to for purposes of illustration. It is understood that the method 600 is not limited to the formation of a complementary silicide structure, but may be used to form any two regions during a semiconductor fabrication process where the first region has one composition or material ratio and the second region has a different composition or material ratio.

Figure 6B:
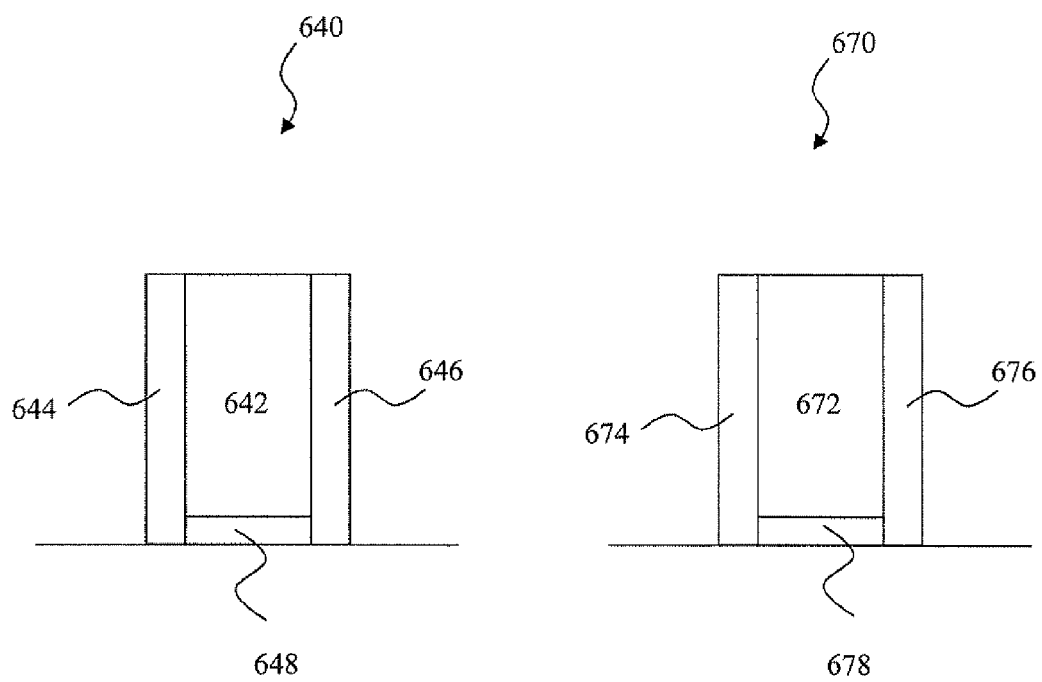

In the present example, the first region is an NMOS 640 and the second region is a PMOS 670, as illustrated in FIG. 6b. It is understood that portions of the NMOS 640 and PMOS 670 may be fabricated prior to the execution of the method 600. For example, the NMOS 640 includes a gate electrode 642, spacers 644 and 646, and a gate dielectric 648. The PMOS 670 includes a gate electrode 672, spacers 674 and 676, and a gate dielectric 678.

Figure 6C:
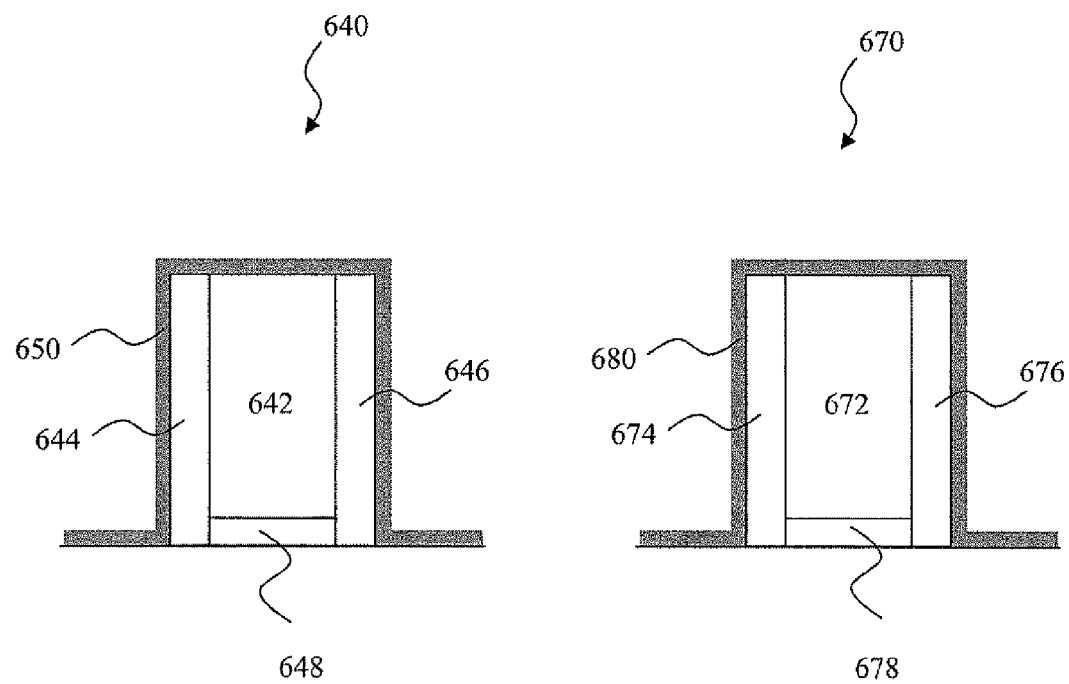

With specific reference now to FIGS. 6a and 6c, the method 600 begins in step 610 with the deposition of first metal portions 650, 680 (which are formed using the same metal 'A') over the NMOS 640 and PMOS 670, respectively. The first metal portions 650, 680 may be deposited using PVD or CVD process. The first metal portions 650, 680 may be nickel, cobalt, tungsten, tantalum, titanium, platinum, erbium, palladium, or any other metal able to interact with silicon at an elevated temperature to form silicide in a low resistance phase state. In the present example, the first metal portions 650, 680 comprise nickel, which may be deposited using a suitable process flow such as HF dipping, an argon pre-sputter etch to prepare the surface, and then nickel sputtering.

Figure 6D:
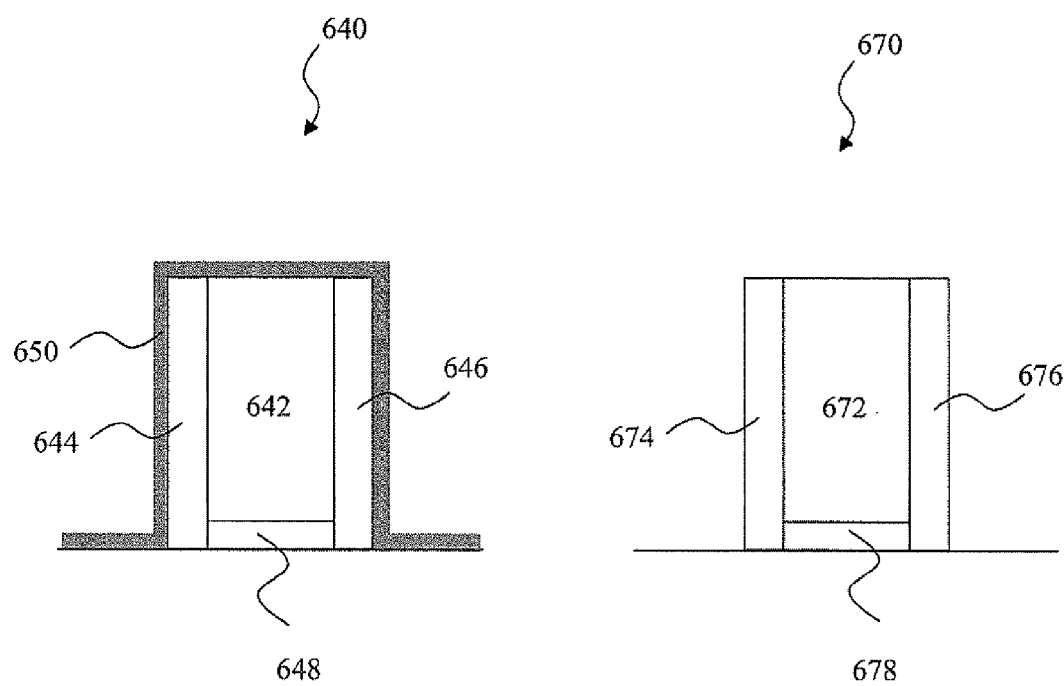

In step 612 and with additional reference to FIG. 6d, the first metal portion 680 may be removed selectively, leaving the first metal portion 650 intact. The first metal portion 680 may be selectively removed using such processes as photolithography and etching. Such processes may include forming photo-resist on both metal portions 650 and 680, transferring the etching pattern from a mask to the photo-resist, etching, and stripping. Alternatively, the etching may follow the stripping. It may be preferable to select the etching process based on the first metal portion 680.

Figure 6E:
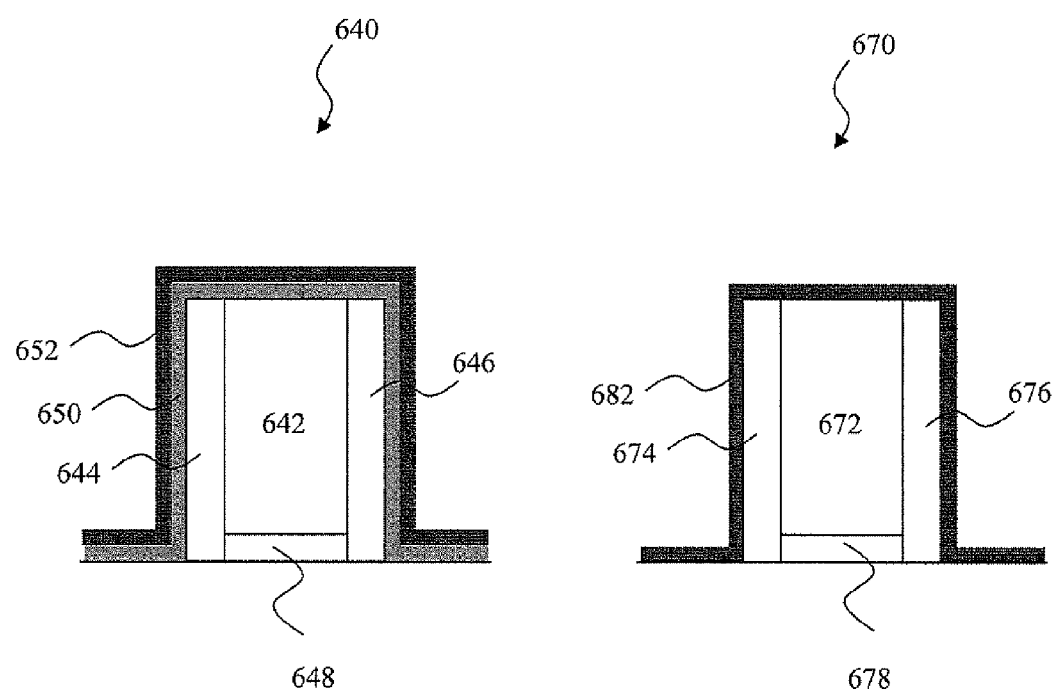

In step 614 and with additional reference to FIG. 6e, second metal portions 652, 682 are deposited over the NMOS 640 and PMOS 670, respectively. The second metal portions 652, 682 are formed using the same metal (metal 'B'), but it is a different metal or metal composition than that used to form the first metal portions 650, 680. The deposition process may use PVD or CVD. The second metal portions 652, 682 may comprise nickel, cobalt, tungsten, tantalum, titanium, platinum, erbium, palladium, or any other metal able to interact with silicon at an elevated temperature to form silicide in a low resistance phase state. In the present example, the second metal portions 652, 682 are cobalt.

Figure 6F:
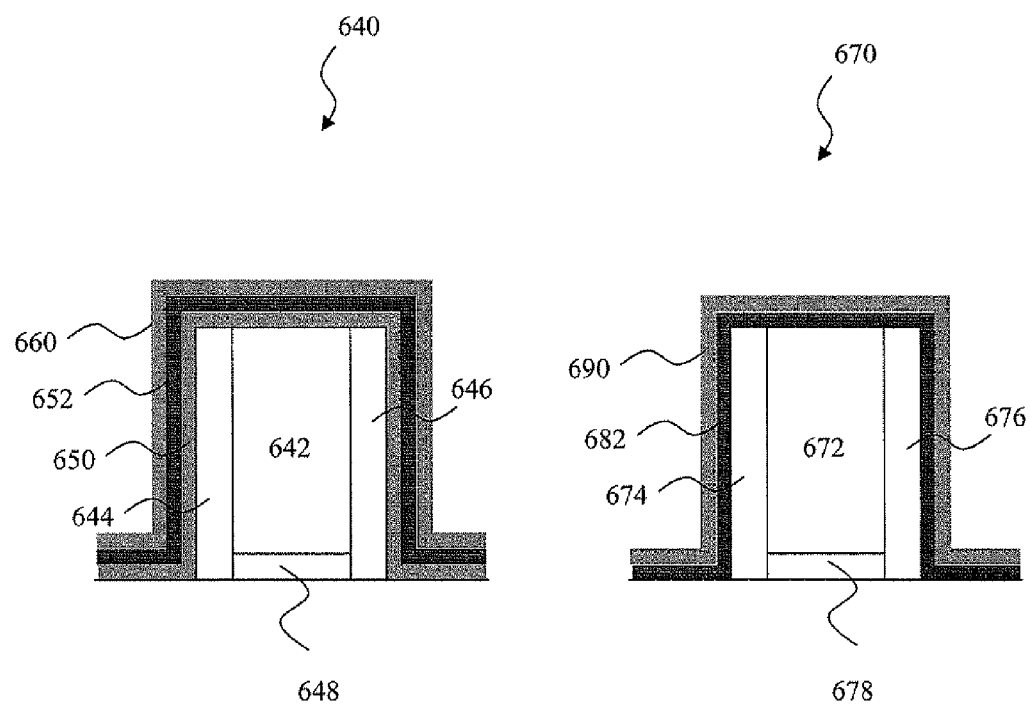

In step 616 and with additional reference to FIG. 6f, third metal portions 660, 690 are deposited over the NMOS 640 and PMOS 670, respectively. The third metal portions 660, 690 are formed using the same metal (metal 'A') as the first metal portions 650, 680. This forms a "sandwich" structure on the NMOS 640 with a layer of metal B formed between two layers of metal A (e.g., nickel/cobalt/nickel). The deposition process may use PVD or CVD. The third metal portions 660, 690 may comprise nickel, cobalt, tungsten, tantalum, titanium, platinum, erbium, palladium, or any other metal able to interact with silicon at an elevated temperature to form silicide in a low resistance phase state. In the present example, the third metal portions 660, 690 are nickel. The nickel may be deposited by a process such as nickel sputtering, with a suitable process flow including HF dipping, an argon pre-sputter etch to prepare the surface, and then nickel sputtering.

Figure 6G:
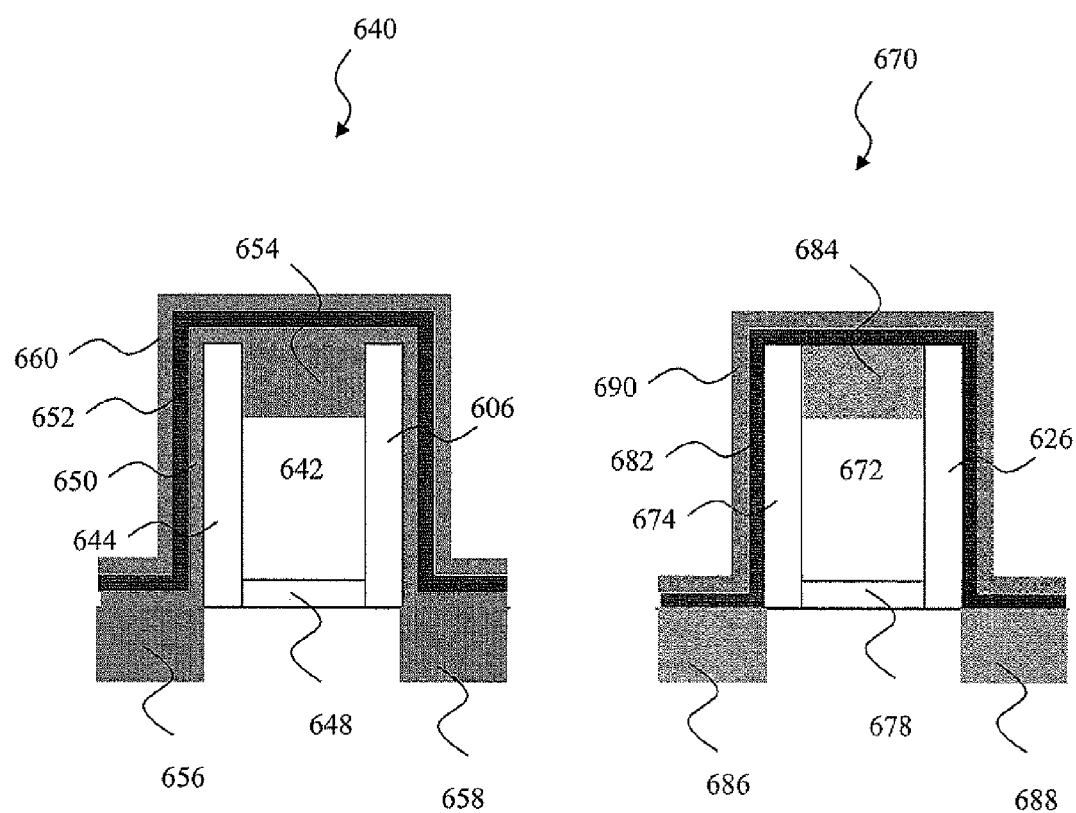

In step 618 and with additional reference to FIG. 6g, a silicide is formed on both the NMOS 640 and the PMOS 670. However, the silicide formed on the NMOS 640 is different than the silicide formed the PMOS 670. This is because the silicide formed on the NMOS 640 is an alloy silicide that contains a relatively large amount of metal A (nickel), while silicide formed on the PMOS 670 contains a lesser amount of metal A. In other words, both are alloy silicides containing metals A and B (e.g., nickel and cobalt), but with different compositions.

As illustrated in FIG. 6g, silicide formed on the gate, source, drain of the NMOS 640 produces gate silicide 654, source silicide 656, and drain silicide 658. Silicide formed on the gate, source, and drain of the PMOS 670 produces gate silicide 684, source silicide 686, and drain silicide 688. The gate silicide 654, source silicide 656, and drain silicide 658 are alloy silicides with a relatively high level of metal A (nickel), while the gate silicide 684, source silicide 686, and drain silicide 688 are alloy silicides with a lower level of metal A. The A/B metal (e.g., nickel/cobalt) ratio in the alloy silicides may be adjusted to provide a desired work function by optimizing metal deposition processing and silicidation processing. Silicidation processing may a reaction between the second metal (or first and second metals) and silicon (or poly-silicon) at an elevated temperature that is selected based on the specific metal or metals. Such reacted silicide may be in metastable phase and may need a second annealing step or RTA, thereby forming a stable silicide phase with reduced resistance. Such a second annealing step may also be implemented after the step 620 (described below) which removes un-reacted metal. It is understood that some silicides, such as nickel silicide, may be formed in a one step RTA at a lower temperature.

Figure 6H:
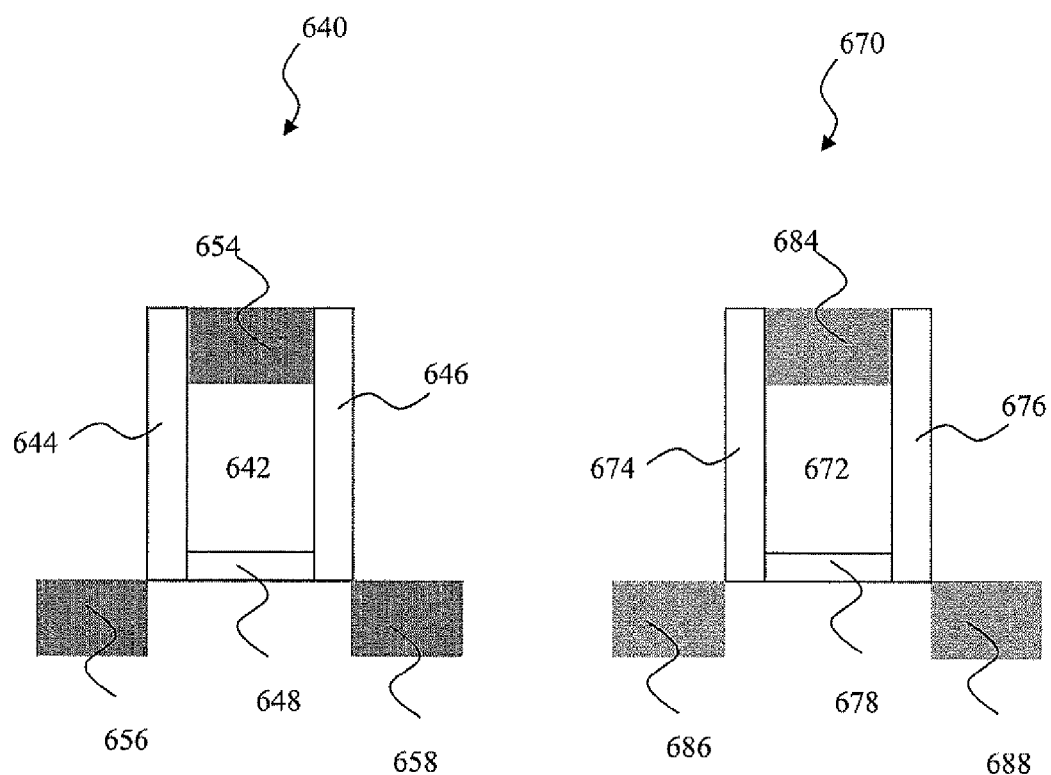

In step 620 and with additional reference to FIG. 6h, un-reacted metals may be removed from both the NMOS 640 and the PMOS 670, as well as other areas (not shown), such as an isolation structure. The metal that lies on isolation areas may not have reacted with an oxide or nitride layer, and may need to be selectively removed using a metal etching solution. This will leave intact the silicide on the polysilicon gate and source/drain contact areas.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor device, comprising:
   a semiconductor substrate;
   a first silicide in a first active region of the substrate, wherein the first silicide is a first alloy silicide comprising a first metal with a first molar composition and a second metal; and
   a second silicide in a second active region of the substrate, wherein the second silicide is a second alloy silicide comprising the first metal with a second molar composition and the second metal, and wherein the first molar composition is different from the second molar composition.

2. The semiconductor device of claim 1 wherein the first silicide is a material selected from a group consisting of nickel silicide, cobalt silicide, tungsten silicide, tantalum silicide, titanium silicide, platinum silicide, erbium silicide, palladium silicide, and combinations thereof.

3. The semiconductor device of claim 1 wherein the second silicide is a material selected from a group consisting of nickel silicide, cobalt silicide, tungsten silicide, tantalum silicide, titanium silicide, platinum silicide, erbium silicide, palladium silicide, and combinations thereof.

4. The semiconductor device of claim 1 wherein the first active region has a first structure and the second active region has a second structure.

5. The semiconductor device of claim 4 wherein the first structure comprises a negative metal-oxide-semiconductor field effect transistor (NMOSFET) and the second structure comprises a positive metal-oxide-semiconductor field effect transistor (PMOSFET).

6. The semiconductor device of claim 4 wherein the first structure comprises a positive metal-oxide-semiconductor field effect transistor (PMOSFET) and the second structure comprises a negative metal-oxide-semiconductor field effect transistor (NMOSFET).

7. The semiconductor device of claim 5 wherein at least one of the first structure and the second structure further comprises a raised source and drain structure, a double gate structure, a multi-finger structure, a high-stress film, a fin field effect transistor (FinFET), or a combination thereof.

8. The semiconductor device of claim 1 wherein at least one of the first and second structure comprises:
   a source;
   a drain; and
   a gate comprising a gate dielectric and a gate electrode.

9. The semiconductor device of claim 8 wherein the gate electrode includes at least one conductive material.

10. The semiconductor device of claim 8 wherein the gate electrode comprises at least one of silicon, germanium, and metal.

11. The semiconductor device of claim 8 wherein the gate electrode is a material selected from a group consisting of polysilicon, polysiliconi-Ge, metal, metal silicide, metal nitride, metal oxide, and a combination thereof.

12. The semiconductor device of claim 8 wherein the gate dielectric is a material selected from a group consisting of silicon oxide, silicon nitride, silicon oxynitride, a high k dielectric, and a combination thereof.

13. The semiconductor device of claim 8 wherein the gate dielectric a high k dielectric material selected from a group consisting of metal oxides, metal nitrides, metal silicates, transition metal-oxides, transition metal-nitrides, transition metal-silicates, oxynitrides of metals, metal aluminates, zirconium silicate, zirconium aluminate, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_xTiO_3$, $PbTiO_3$, $BaTiO_3$, $SrTiO_3$, $PbZrO_3$, PST, PZN, PZT, PMN, and combinations thereof.

14. The semiconductor device of claim 13 wherein the high k material has a permittivity greater than approximately 10.

15. The semiconductor device of claim 13 wherein the high k material has a permittivity greater than approximately 15.

16. The semiconductor device of claim 13 wherein the high k material has a permittivity greater than approximately 20.

17. The semiconductor device of claim 1 wherein the semiconductor substrate is an elementary semiconductor.

18. The semiconductor device of claim 1 wherein the semiconductor substrate is silicon.

19. The semiconductor device of claim 1 wherein the semiconductor substrate is germanium.

20. The semiconductor device of claim 1 wherein the semiconductor substrate further comprises a multilayer compound semiconductor structure.

21. The semiconductor device of claim 1 wherein the semiconductor substrate comprises a compound semiconductor.

22. The semiconductor device of claim 19 wherein the semiconductor substrate comprises silicon and germanium.

23. The semiconductor device of claim 1 wherein the semiconductor substrate comprises an alloy semiconductor.

24. The semiconductor device of claim 23 wherein the semiconductor substrate comprises a material selected from a group consisting silicon, germanium, carbon, and a combination thereof.

25. The semiconductor device of claim 24 wherein the semiconductor substrate is SiGe.

26. The semiconductor device of claim 25 wherein the semiconductor substrate has a gradient SiGe structure.

27. The semiconductor device of claim 1 wherein the semiconductor substrate is a semiconductor on insulator.

28. The semiconductor device of claim 27 wherein the semiconductor substrate is a silicon on insulator.

29. The semiconductor device of claim 1 wherein the first silicide has a work function below approximately 4.4 eV.

30. The semiconductor device of claim 1 wherein the second silicide has a work function above approximately 4.7 eV.

31. The semiconductor device of claim 1 wherein the first metal is nickel and the second metal is cobalt.

* * * * *